United States Patent
Pang et al.

(10) Patent No.: US 9,666,593 B2
(45) Date of Patent: May 30, 2017

(54) ALTERNATING REFRACTIVE INDEX IN CHARGE-TRAPPING FILM IN THREE-DIMENSIONAL MEMORY

(71) Applicant: SanDisk Technologies Inc., Plano, TX (US)

(72) Inventors: Liang Pang, Fremont, CA (US);
Yingda Dong, San Jose, CA (US);
Jayavel Pachamuthu, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 60 days.

(21) Appl. No.: 14/500,644

(22) Filed: Sep. 29, 2014

(65) Prior Publication Data
US 2016/0093636 A1 Mar. 31, 2016

(51) Int. Cl.
*H01L 27/11582* (2017.01)
*H01L 29/792* (2006.01)
(Continued)

(52) U.S. Cl.
CPC .... *H01L 27/11582* (2013.01); *H01L 27/1052* (2013.01); *H01L 27/1157* (2013.01);
(Continued)

(58) Field of Classification Search
CPC ..... H01L 21/823487; H01L 21/823885; H01L 27/11582; H01L 29/66666; H01L 27/1157;
(Continued)

(56) References Cited

U.S. PATENT DOCUMENTS 4,870,470 A 9/1989 Bass, Jr. et al.
6,475,722 B1 * 11/2002 Henck ............... B01L 3/502707
204/450
(Continued)

FOREIGN PATENT DOCUMENTS

EP 2626903 A1 8/2013

OTHER PUBLICATIONS

International Search Report & The Written Opinion of the International Searching Authority dated Jan. 21, 2016, International Application No. PCT/US2015/048000.
(Continued)

*Primary Examiner* — Michael Jung
*Assistant Examiner* — Mikka Liu
(74) *Attorney, Agent, or Firm* — Vierra Magen Marcus LLP

(57) ABSTRACT

Techniques are provided for fabricating a three-dimensional, charge-trapping memory device with improved long term data retention. A corresponding three-dimensional, charge-trapping memory device is also provided which includes a stack of alternating word line layers and dielectric layers. A charge-trapping layer is deposited in a memory hole. The refractive index of portions of the charge-trapping layer which are adjacent to the word line layers is increased relative to the refractive index of portions of the charge-trapping layer which are adjacent to the dielectric layers. This can be achieved by doping the portions of the charge-trapping layer which are adjacent to the word line layers. In one approach, the charge-trapping layer is SiON and is doped with Si or N. In another approach, the charge-trapping layer is HfO and is doped with Hf. In another approach, the charge-trapping layer is HfSiON and is doped with Hf, Si or N.

12 Claims, 19 Drawing Sheets

(51) Int. Cl.
*H01L 27/1157* (2017.01)
*H01L 29/66* (2006.01)
*H01L 27/105* (2006.01)

(52) U.S. Cl.
CPC .. *H01L 29/66666* (2013.01); *H01L 29/66833* (2013.01); *H01L 29/7926* (2013.01)

(58) Field of Classification Search
CPC ........... H01L 29/7926; H01L 29/66833; H01L 27/11578; H01L 21/28282
See application file for complete search history.

(56) References Cited

U.S. PATENT DOCUMENTS

| | | | |
|---|---|---|---|
| 6,797,650 | B1 | 9/2004 | Wang et al. |
| 7,326,980 | B2 | 2/2008 | Ahn et al. |
| 8,067,794 | B2 | 11/2011 | Ahn et al. |
| 8,283,228 | B2 | 10/2012 | Alsmeier |
| 8,415,742 | B2 | 4/2013 | Kim et al. |
| 2005/0258475 | A1* | 11/2005 | Aronowitz ............ H01L 29/517 257/324 |
| 2006/0261401 | A1* | 11/2006 | Bhattacharyya ....... B82Y 10/00 257/316 |
| 2006/0284236 | A1* | 12/2006 | Bhattacharyya ....... B82Y 10/00 257/314 |
| 2008/0135946 | A1* | 6/2008 | Yan ................... H01L 21/28282 257/390 |
| 2008/0293255 | A1* | 11/2008 | Ramkumar ....... H01L 21/28282 438/770 |
| 2009/0004802 | A1* | 1/2009 | Joo ................... H01L 21/28282 438/287 |
| 2009/0134450 | A1* | 5/2009 | Kim ................... G11C 16/0416 257/325 |
| 2011/0233648 | A1* | 9/2011 | Seol ................. H01L 21/32137 257/324 |
| 2012/0122297 | A1* | 5/2012 | Na .................... H01L 21/28273 438/435 |
| 2012/0312992 | A1* | 12/2012 | Cannata .................... G01J 5/20 250/349 |
| 2013/0087846 | A1* | 4/2013 | Lee .................. H01L 27/11582 257/324 |
| 2013/0161629 | A1 | 6/2013 | Han et al. |
| 2013/0248965 | A1* | 9/2013 | Nakai ................... H01L 29/788 257/315 |
| 2013/0264631 | A1 | 10/2013 | Alsmeier et al. |
| 2013/0307052 | A1* | 11/2013 | Jenne ................ H01L 21/28282 257/325 |
| 2014/0170861 | A1 | 6/2014 | Pallem et al. |
| 2015/0049548 | A1* | 2/2015 | Park ........................ G11C 16/26 365/185.11 |
| 2015/0194440 | A1* | 7/2015 | Noh .................. H01L 29/66833 257/324 |

OTHER PUBLICATIONS

Tang, Zhenjie, et al., "Progress of High-k Dielectrics Applicable to SONOS-Type Nonvolatile Semiconductor Memories," Transactions on Electrical and Electronic Materials, vol. 11, No. 4, Aug. 25, 2010, pp. 155-165.

Gou, Hong-Yan, et al., "Influence of HfAlO composition on memory effects of metal-oxide-semiconductor capacitors with Al2O3/HfA1O/Al2O3 layers and Pd electrode," Thin Solid Films, Science Direct.com, Jul. 22, 2012, 5 pages.

Liao, Jeng-Hwa, et al., "Physical and electrical characteristics of silicon oxynitride films with various refractive indices," Journal of Physics D: Applied Physics, Aug. 12, 2009, 8 pages.

Yim, C.J., et al., "Effect of Incorporated Nitrogen on the Band Alignment of Ultrathin Silicon-oxynitried Films as a Function of the Plasma Nitridation Conditions," Journal of the Korean Physical Society, vol. 58, No. 5, May 2011, pp. 1169-1173.

Invitation to Pay Additional Fees dated Nov. 13, 2015, International Application No. PCT/US2015/048000.

* cited by examiner

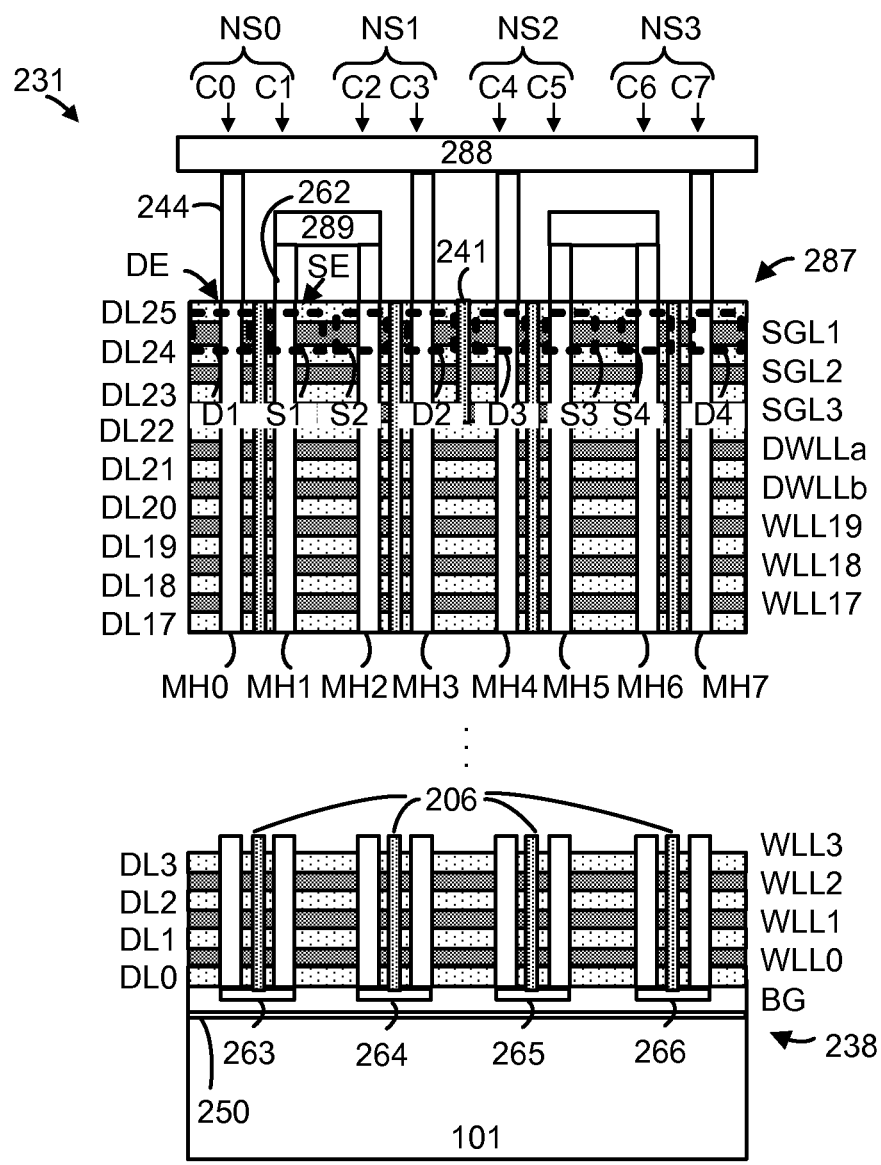

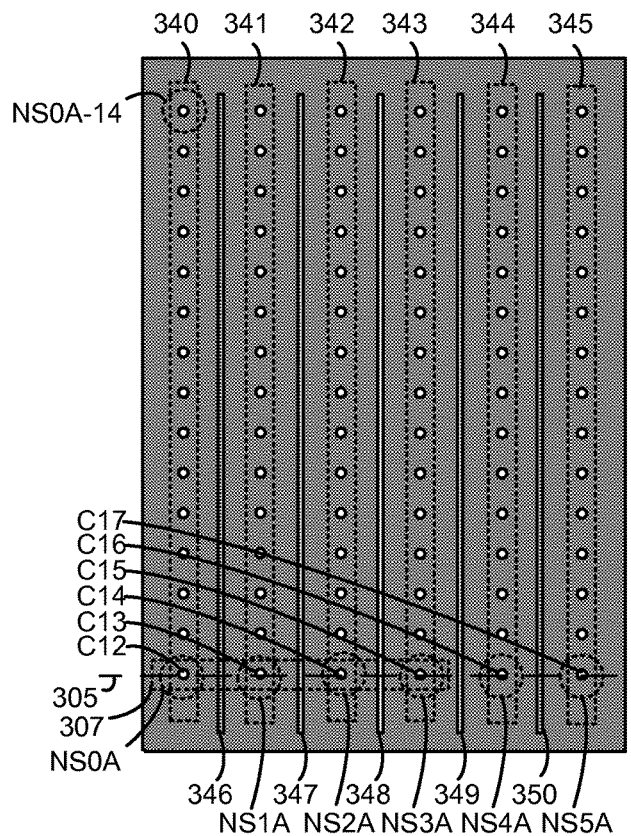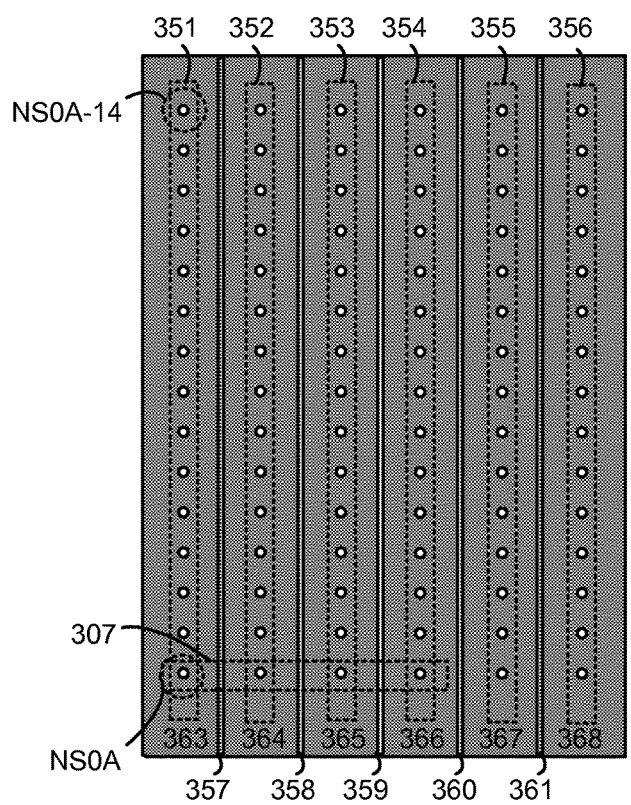

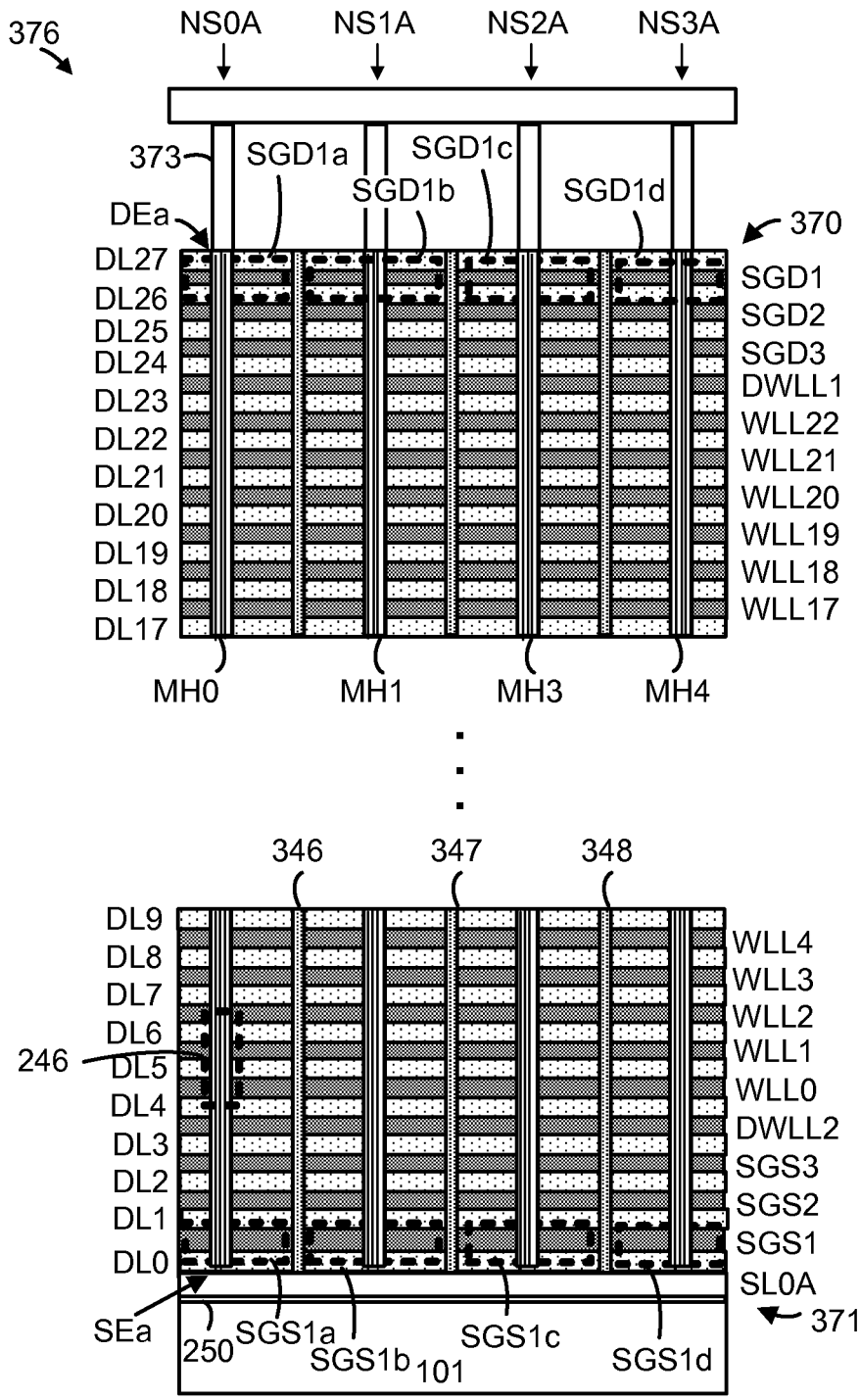

Fig. 3C2
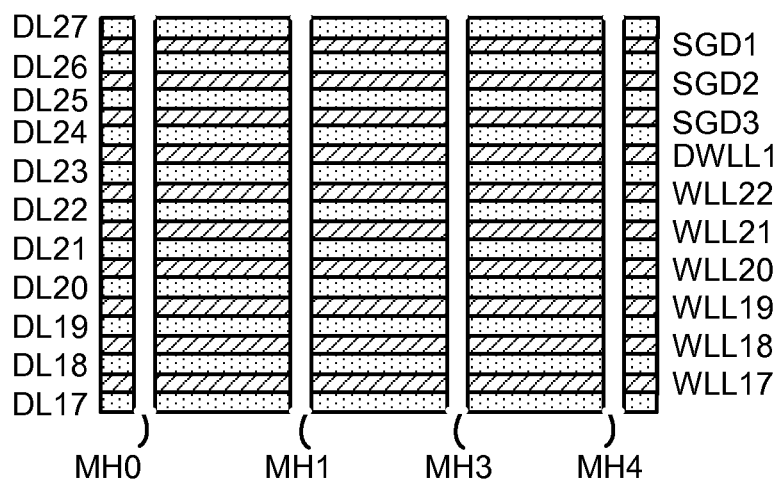
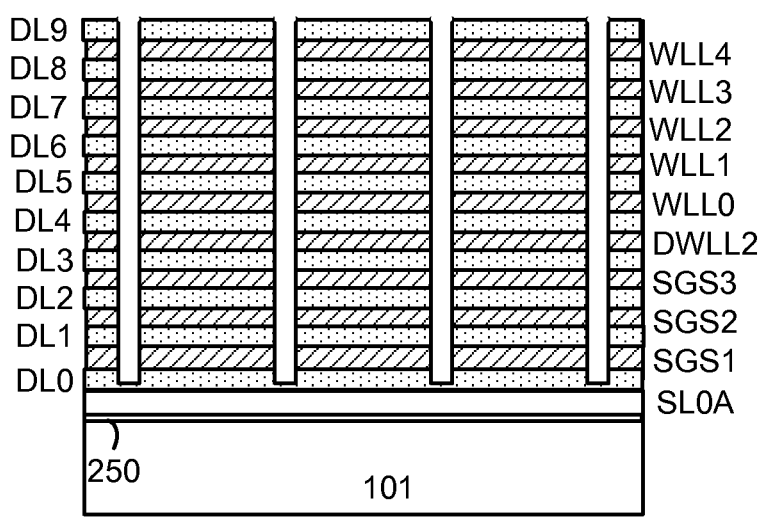

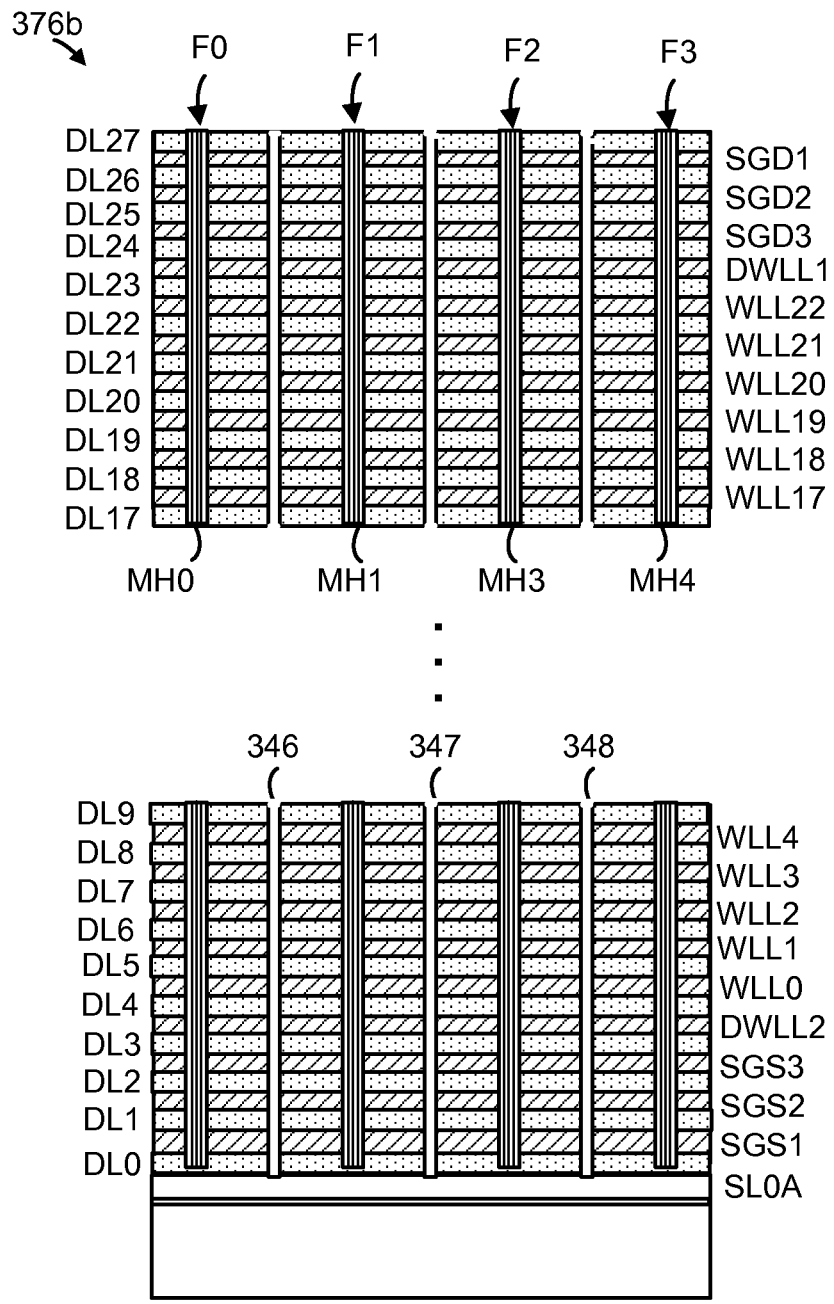

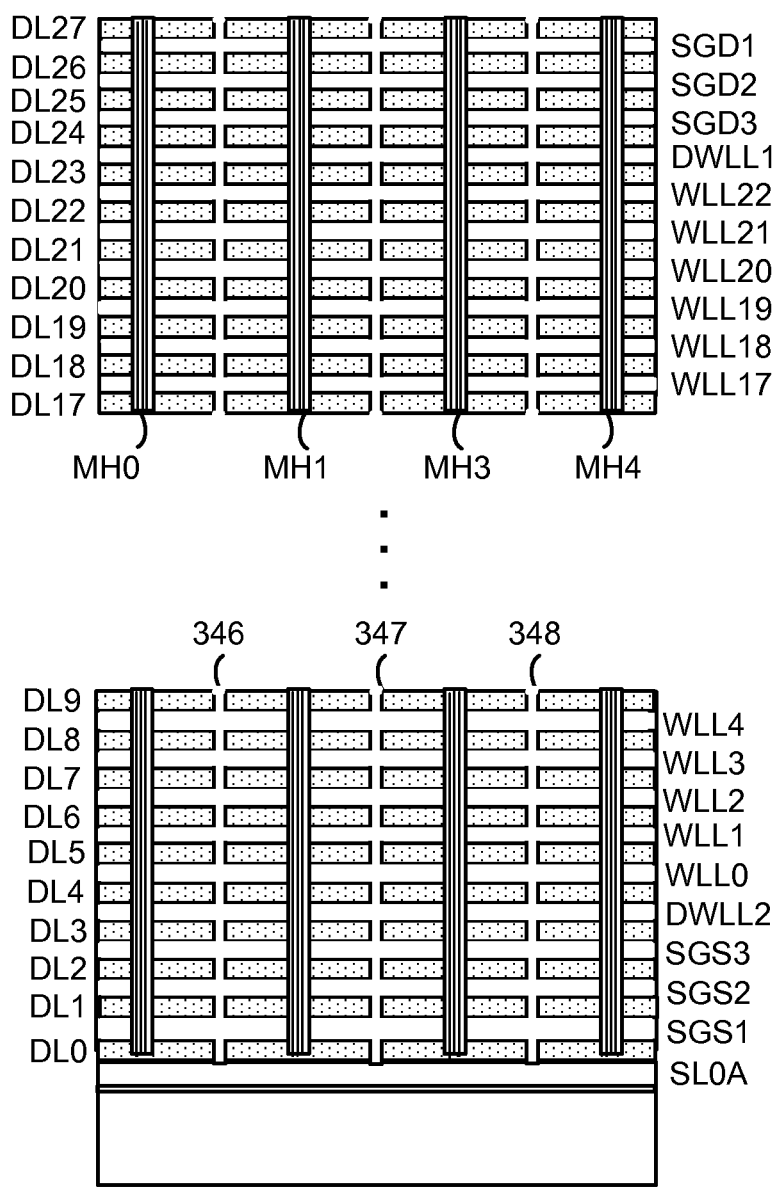
Fig. 3C4

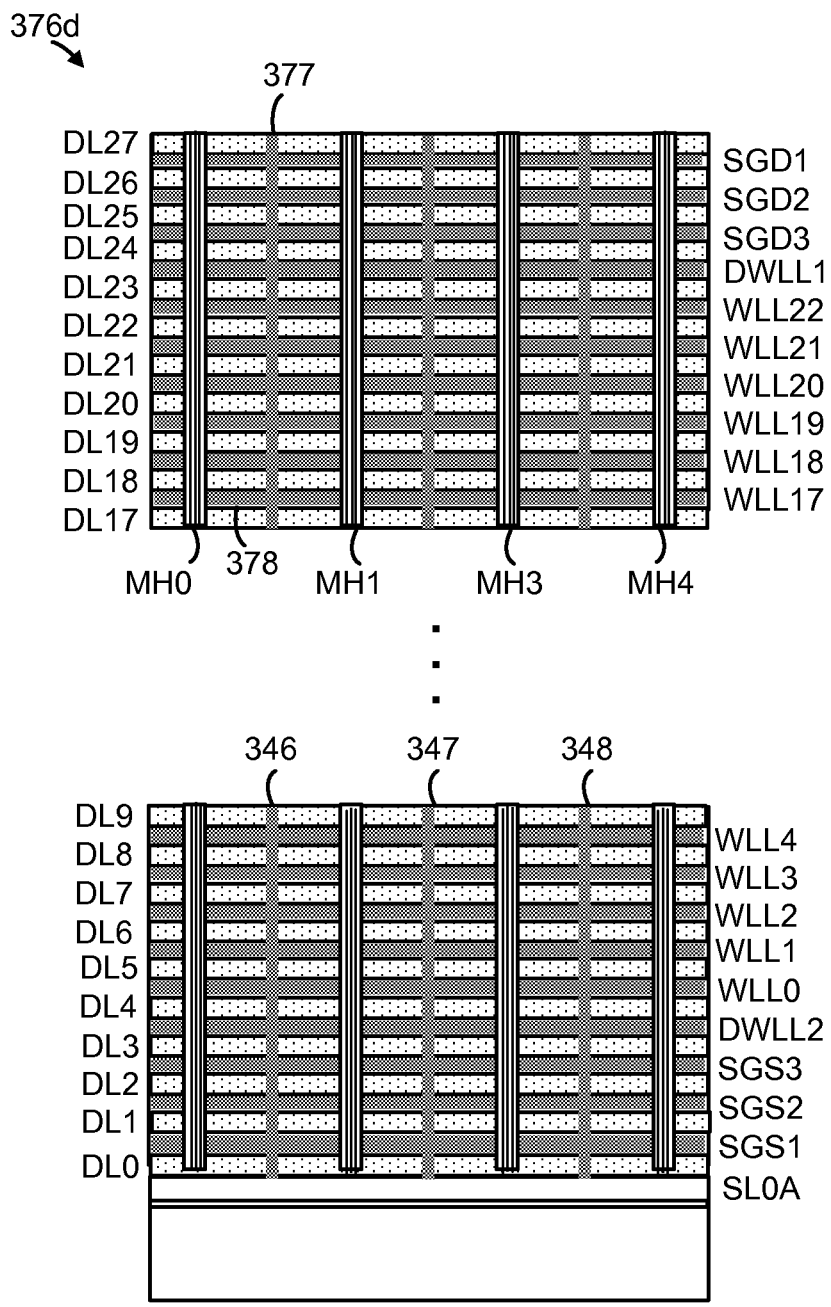

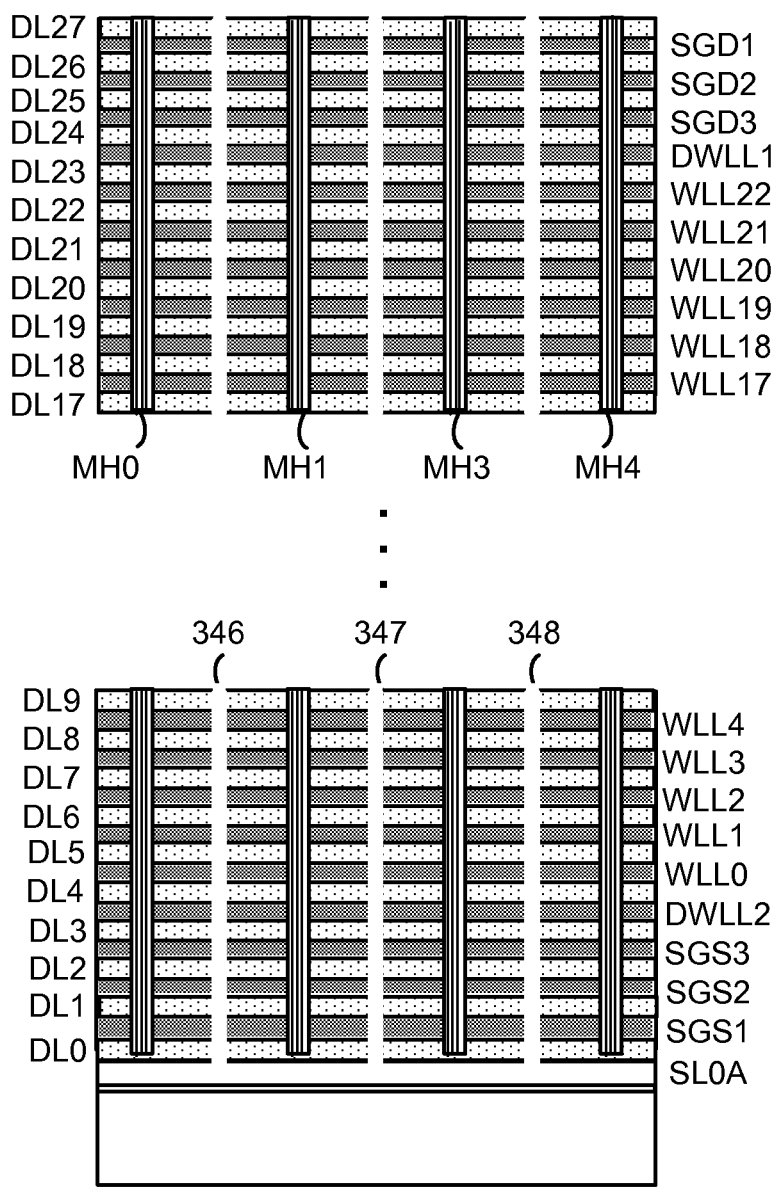
Fig. 3C6

Fig. 4A1
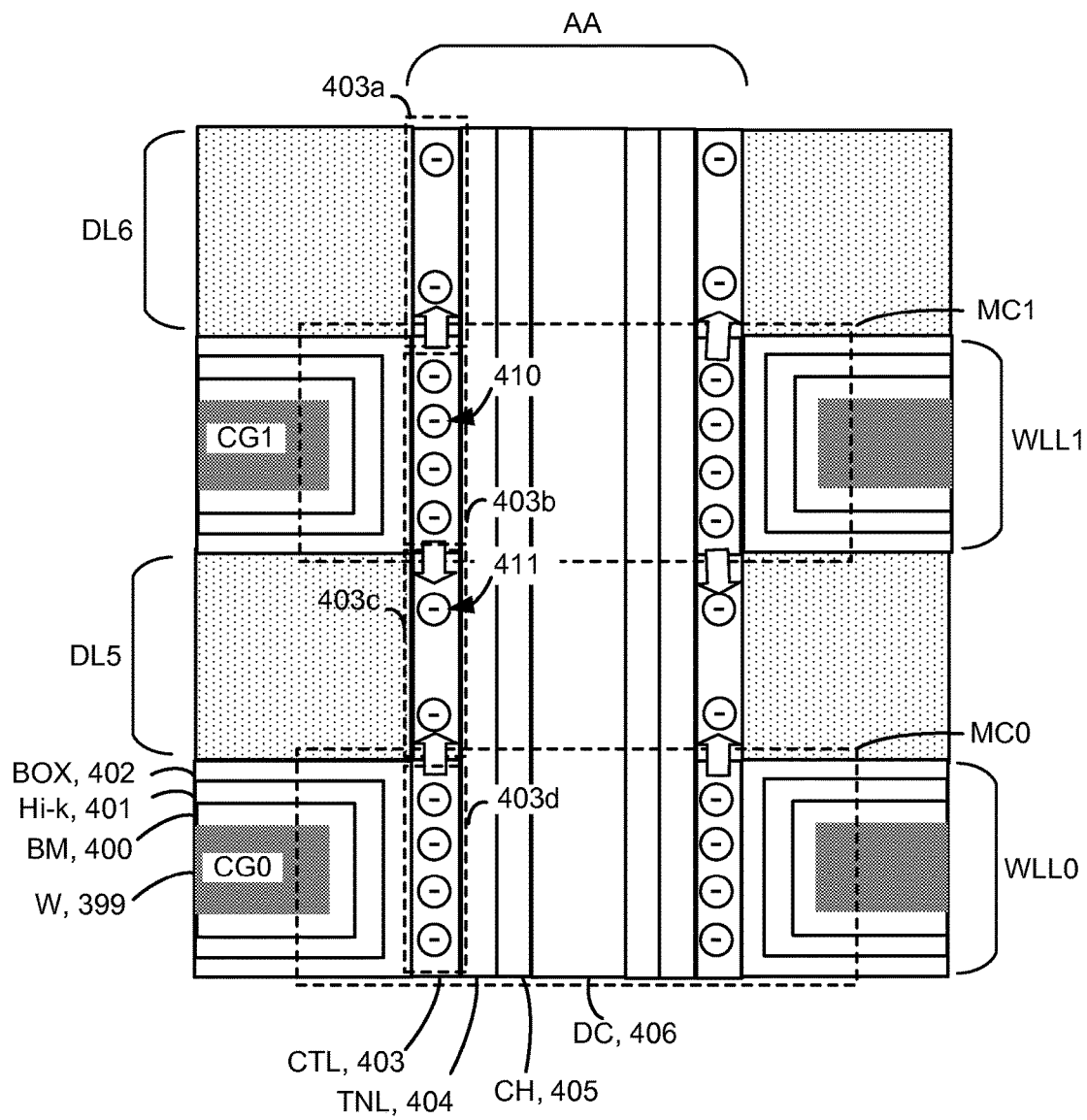
Fig. 4A2
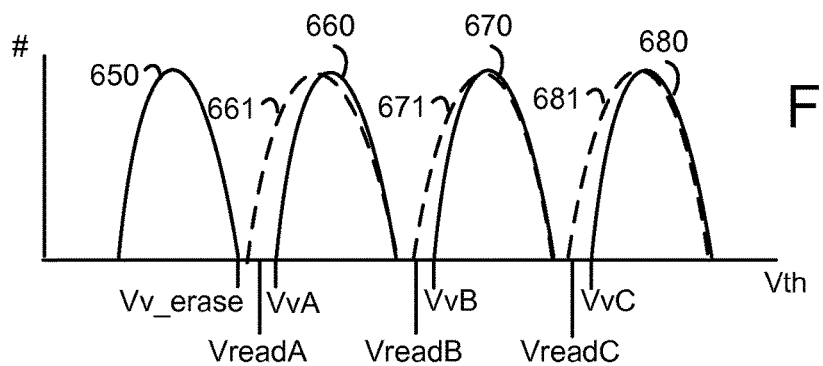

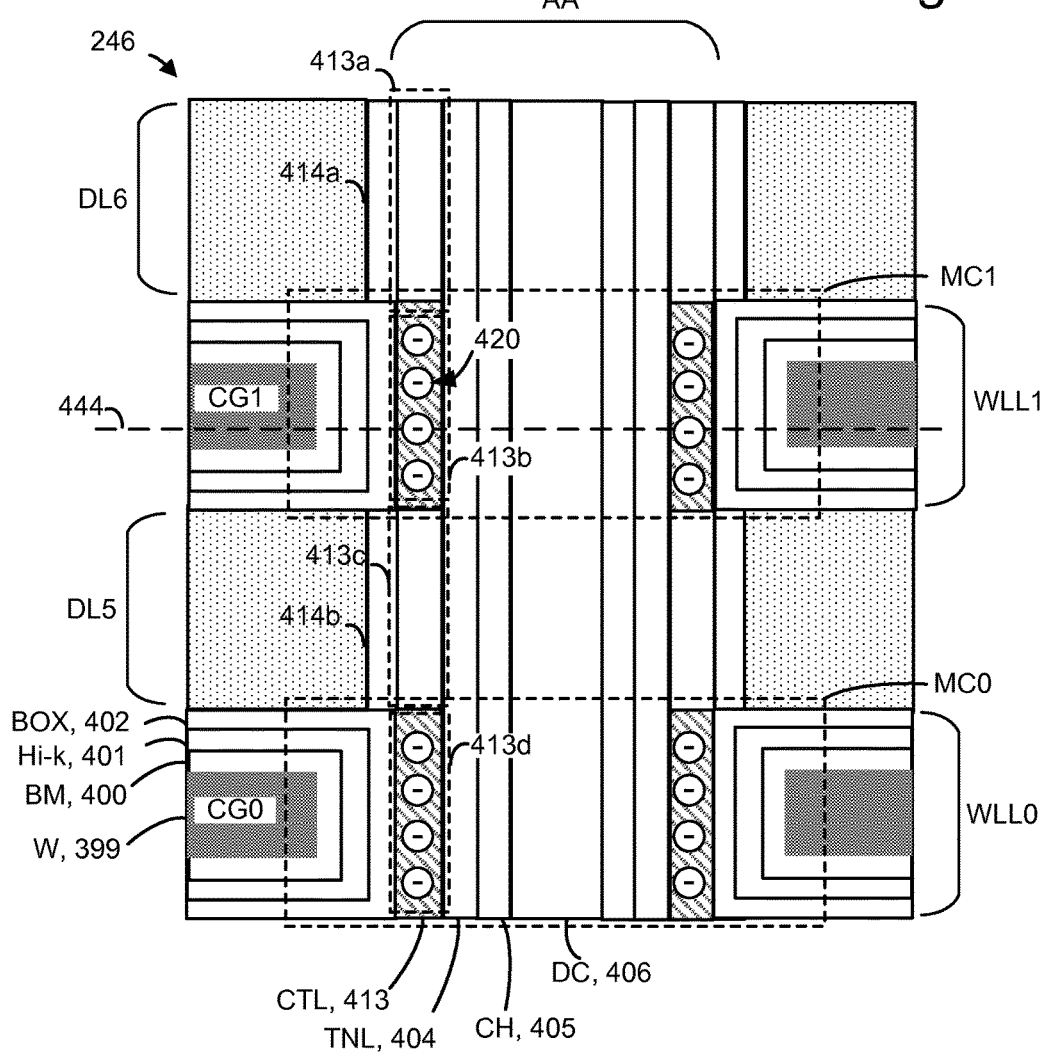
Fig. 4B1
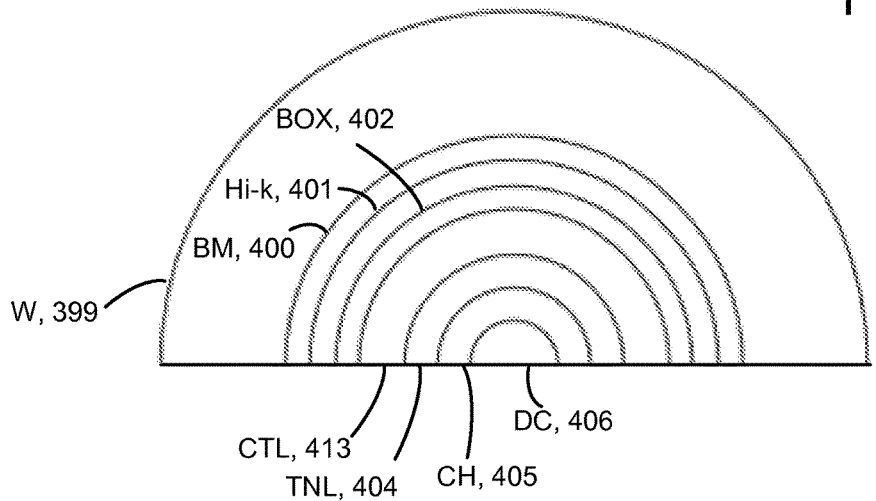
Fig. 4B2

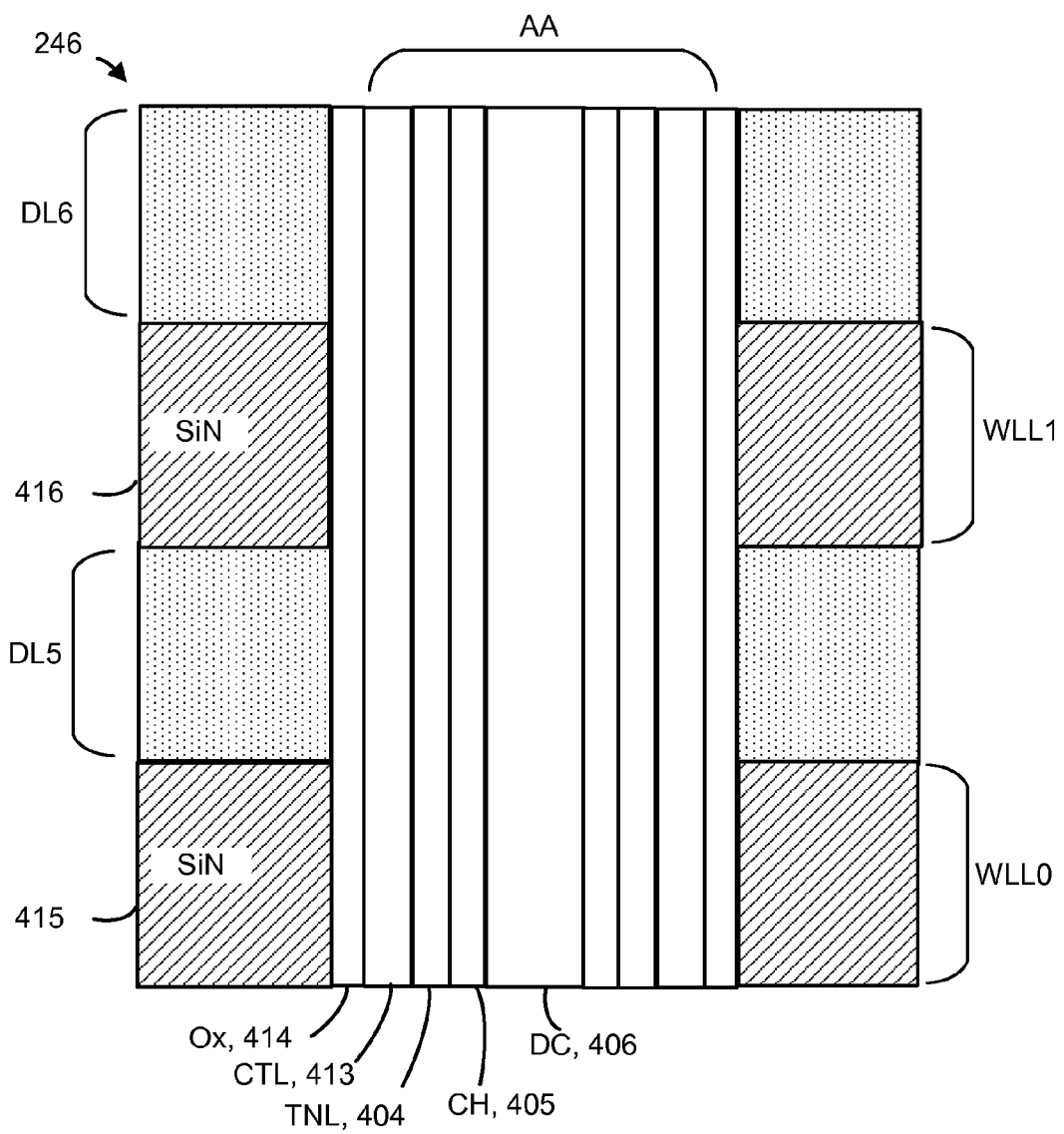
Fig. 4B3

Fig. 4B4
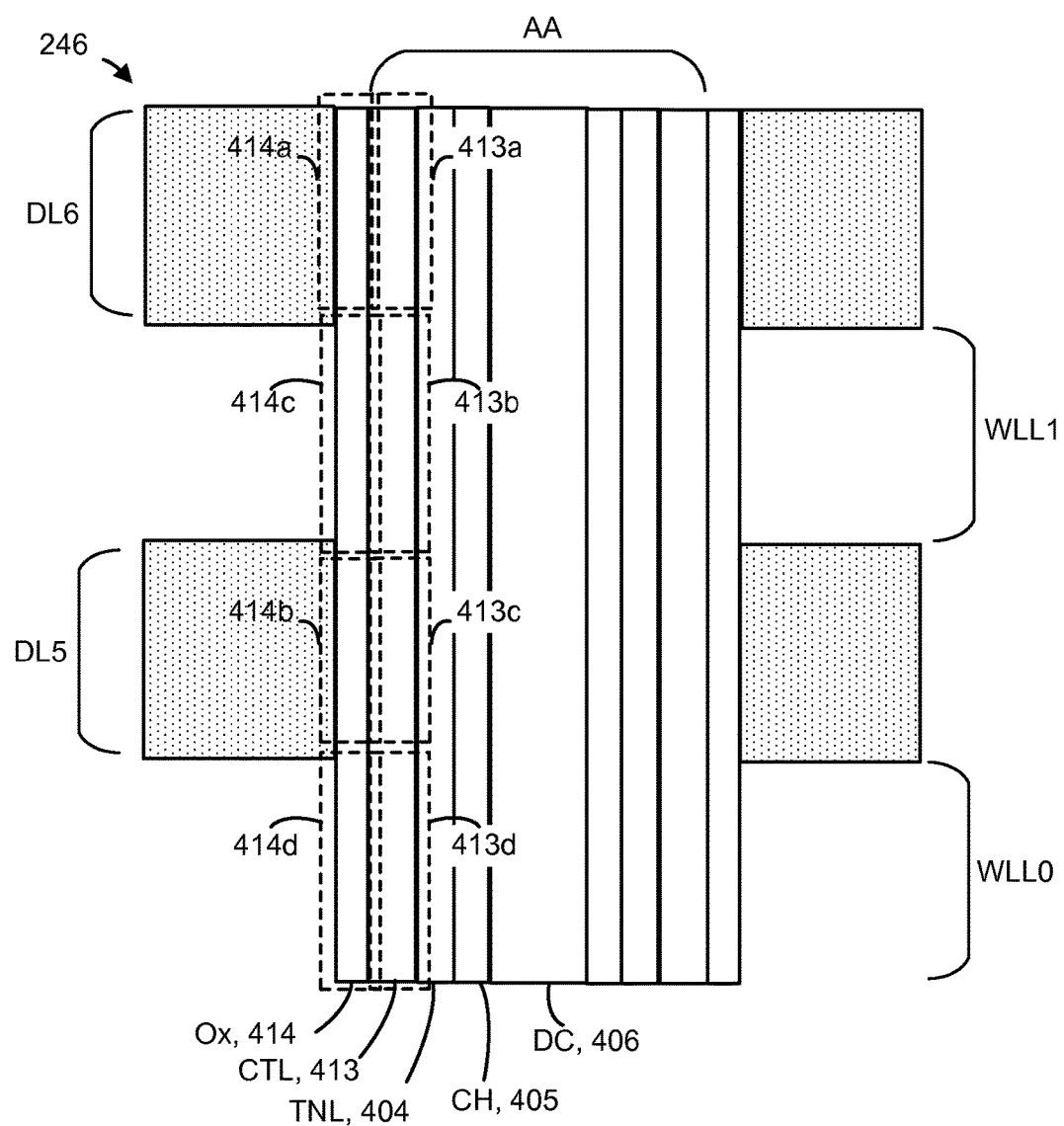

Fig. 4B5
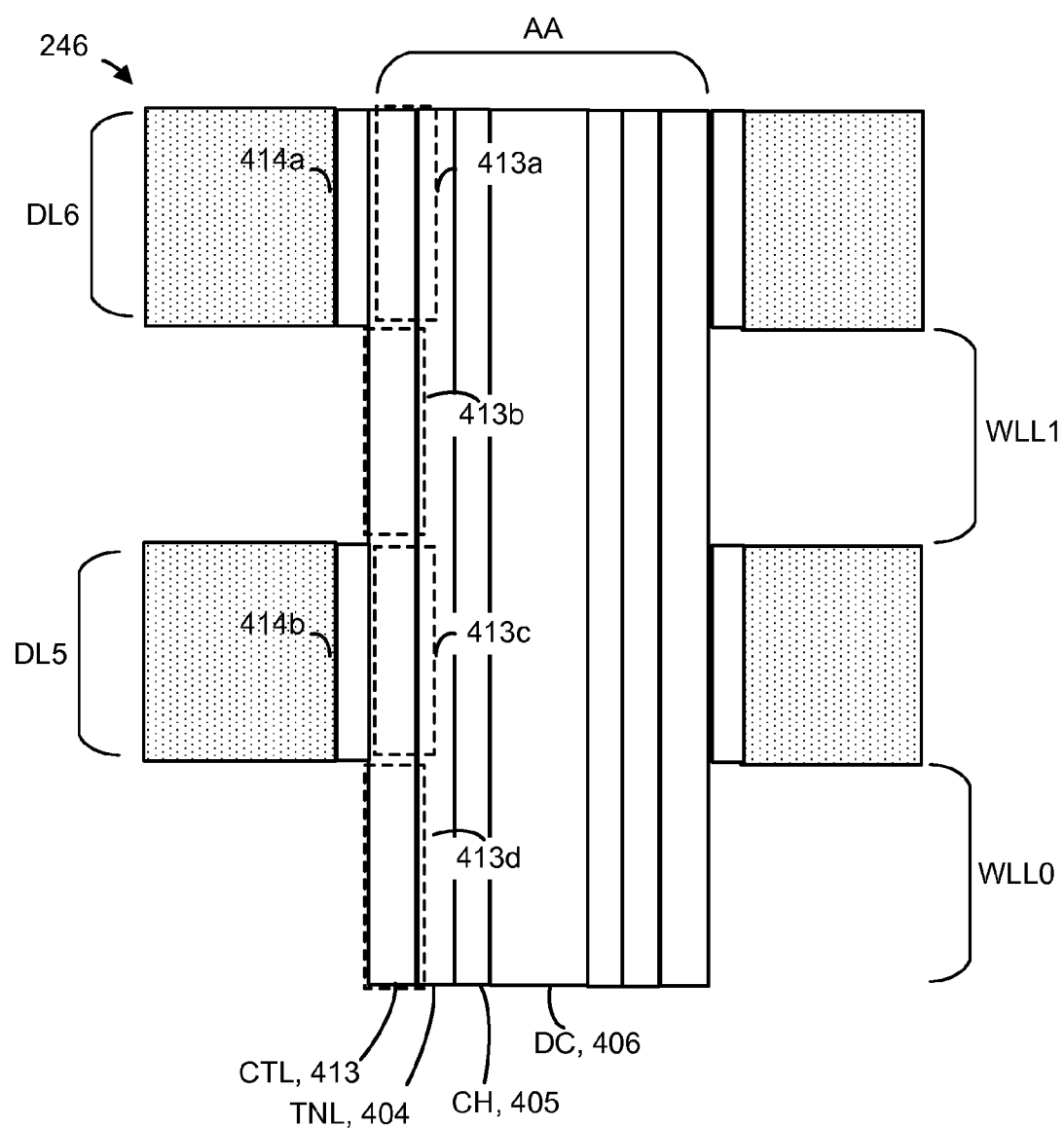

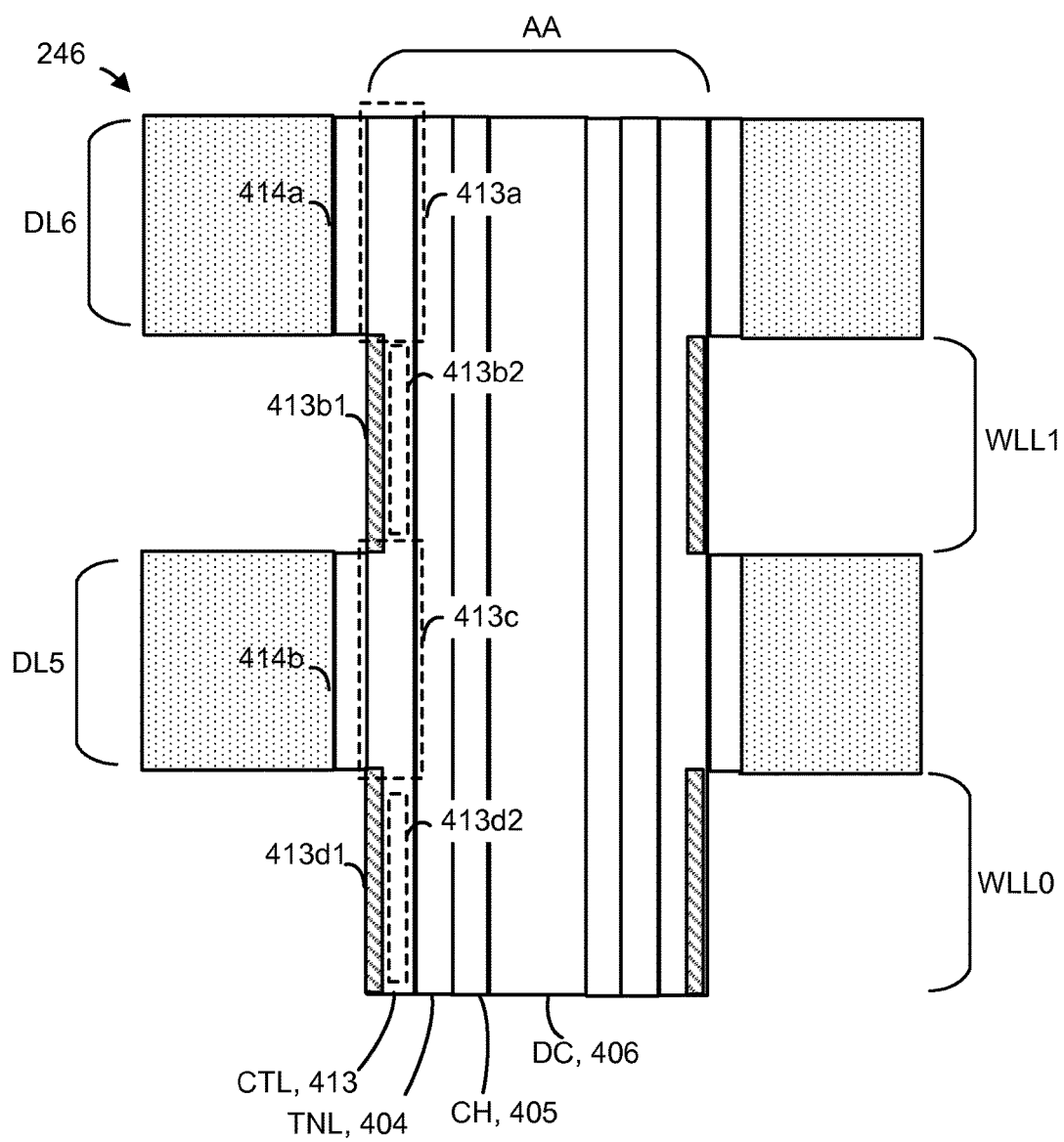
Fig. 4B6

Fig. 4B7
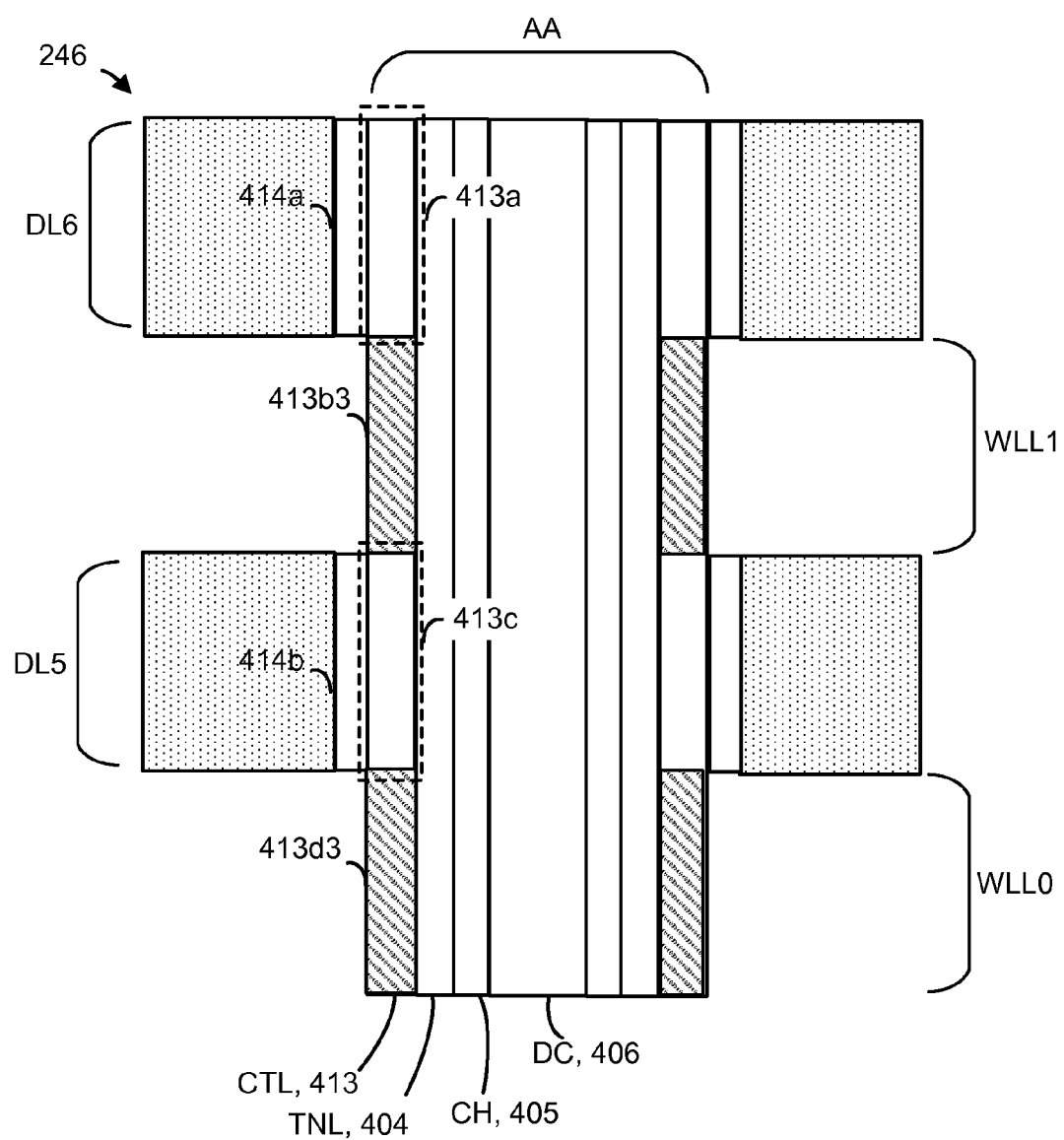

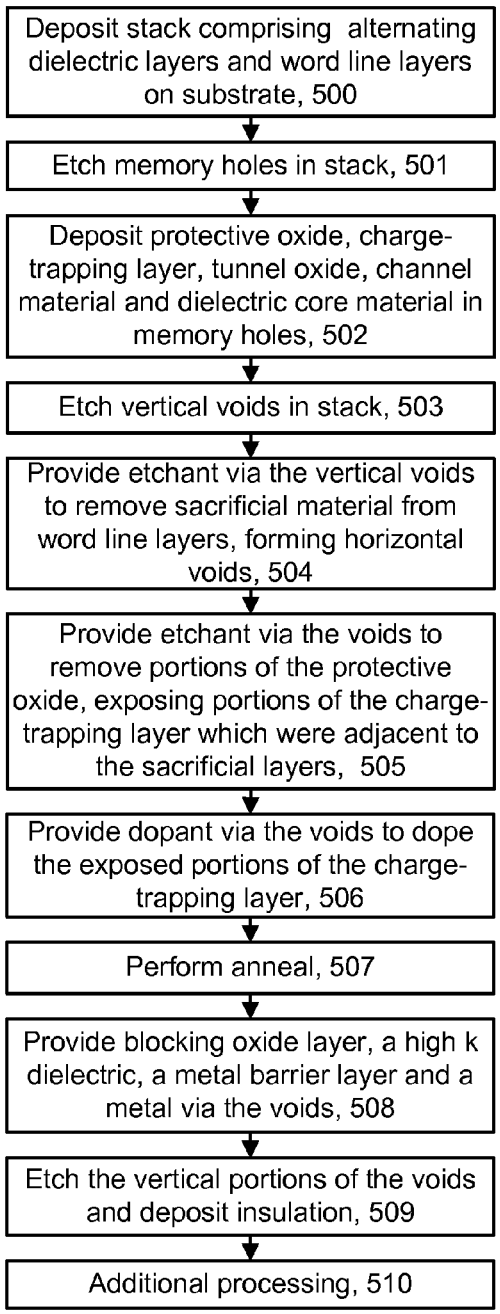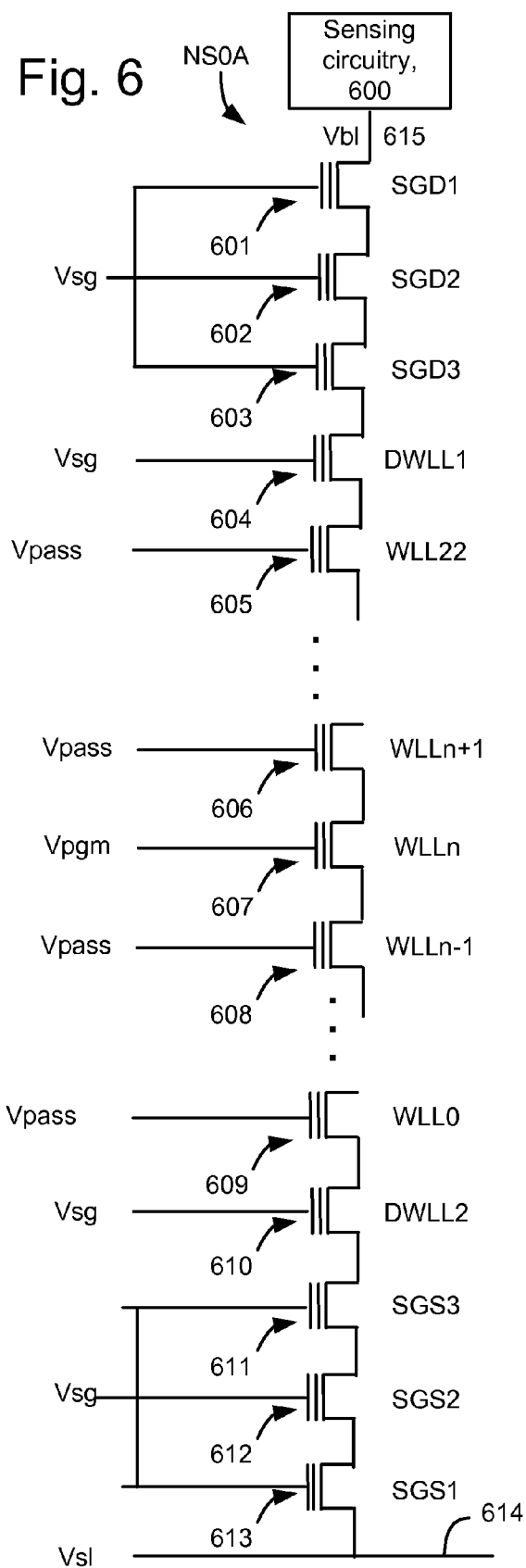

| Case | WL-adjacent portions | Dielectric-adjacent portions |
|---|---|---|
| 1 | Si-rich SiON | SiON |
| 2 | N-rich SiON | SiON |
| 3 | Hf-doped HfO | HfO |
| 4 | Hf-rich HfSiON | HfSiON |
| 5 | Si-rich HfSiON | HfSiON |
| 6 | N-rich HfSiON | HfSiON |
| 7 | Al-doped AlO | AlO |
| 8 | Zr-rich ZrO2 | ZrO2 |
| 9 | Y-rich Y2O3 | Y2O3 |
| 10 | Hf-rich HfAlO | HfAlO |
| 11 | Al-rich HfAlO | HfAlO |
| 12 | Si-rich SiN | SiN |
| 13 | SiCN | SiN |
| 14. | SIBN | SiN |

US 9,666,593 B2

ALTERNATING REFRACTIVE INDEX IN CHARGE-TRAPPING FILM IN THREE-DIMENSIONAL MEMORY

BACKGROUND

The present technology relates to operation of memory devices.

A charge-trapping layer can be used in memory devices to store a charge which represents a data state. For example, the charge-trapping layer can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

However, various challenges are presented in operating such memory devices.

BRIEF DESCRIPTION OF THE DRAWINGS

Like-numbered elements refer to common components in the different figures.

FIG. 2C depicts an embodiment of a stack 231 showing a cross-sectional view of the portion 209 of FIG. 2A, along line 220.

FIG. 3A depicts a top view of an example word line layer 304 of the block BLK0 of FIG. 1A, in a straight NAND string embodiment.

FIG. 3B depicts a top view of an example SGD layer 362, consistent with FIG. 3A.

FIG. 3C1 depicts an embodiment of a stack 376 showing a cross-sectional view of the portion 307 of FIG. 3A, along line 305.

FIG. 3C2 to 3C6 show the stack 376 of FIG. 3C1 in successive phases of fabrication before the configuration of FIG. 3C1, consistent with the process of FIG. 5.

FIG. 3C2 shows a stack comprising alternating word line layers and dielectric layers, where memory holes have been formed, consistent with step 500 of FIG. 5.

FIG. 3C3 shows a stack which is formed from the stack of FIG. 3C2 after depositing materials in the memory holes, consistent with steps 501 and 502 of FIG. 5.

FIG. 3C4 shows a stack which is formed from the stack of FIG. 3C3 after etching away of the sacrificial material in the word line layers, consistent with steps 503 to 505 of FIG. 5.

FIG. 3C5 shows a stack which is formed from the stack of FIG. 3C4 after depositing the metal for the word lines, consistent with step 508 of FIG. 5.

FIG. 3C6 shows a stack which is formed from the stack of FIG. 3C5 after etching away material in the voids, consistent with step 509 of FIG. 5.

FIG. 4A1 depicts a view of the region 246 of FIG. 3C1 in an embodiment in which charge loss occurs by lateral diffusion due to a uniform refractive index in the charge-trapping layer 403.

FIG. 4A2 depicts widening of threshold voltage distributions due to lateral charge diffusion, in an example embodiment in which there is an erased state and three programmed states, consistent with FIG. 4A1.

FIG. 4B1 depicts a view of the region 246 of FIG. 3C1 in an embodiment in which charge loss by lateral diffusion is reduced due to an increased refractive index in portions of the charge-trapping layer 403 which are adjacent to the word line layers.

FIG. 4B2 depicts a partial cross-sectional view of the region 246 of FIG. 4B1 along line 444.

FIG. 4B3 to 4B7 show the region 246 of FIG. 4B1 in successive phases of fabrication, consistent with the process of FIG. 5 and with FIG. 3C1 to 3C6.

FIG. 4B3 shows the region 246 after processing which is consistent with steps 500 to 502 of FIG. 5 and with FIG. 3C3.

FIG. 4B4 shows the region 246 after processing which is consistent with steps 503 to 504 of FIG. 5 and with FIG. 3C4.

FIG. 4B5 shows the region 246 after processing which is consistent with step 505 of FIG. 5 and with FIG. 3C4.

FIG. 4B6 shows the region 246 after processing which is consistent with step 506 of FIG. 5.

FIG. 4B7 shows the region 246 after processing which is consistent with step 507 of FIG. 5.

FIG. 5 depicts an example process for fabricating a memory device such as in FIGS. 3C1 and 4B1.

FIG. 6 depicts a circuit diagram of a NAND string consistent with the memory devices of FIGS. 2C and 3C1.

FIG. 7 is a table of example materials for the word line-adjacent portions and the dielectric-adjacent portions of a charge-trapping layer.

FIG. 8 depicts a plot of atomic percent versus refractive index (RI) for SiON with varying amounts of O and N.

DETAILED DESCRIPTION

Techniques are provided for fabricating a three-dimensional (3D), charge-trapping memory device with improved long term data retention.

In a charge-trapping memory device, a continuous charge-trapping region may extend throughout a NAND string, for instance, where different portions of the charge-trapping region are associated with different respective memory cells of the NAND string. The different respective memory cells are connected to different respective word lines. For example, a 3D memory device may comprise a stack of alternating word line layers and dielectric layers. Each memory cell has a control gate which receives a program voltage (Vpgm) via respective word line when it is programmed. For each programmed memory cell, the program voltage causes charges (electrons) to move from a channel region to a respective portion of the charge-trapping region, where the charges are stored to represent a programmed data state of the memory cell. Some cells are not programmed and remain in an erased state.

However, after programming, the electrons can diffuse laterally from the charge-trapping region of one memory cell toward the charge-trapping region of an adjacent memory cell by hopping through shallow traps in the charge-trapping layer. Moreover, this diffusion may be a function of the programmed state of the cells, such that there is a greater tendency for diffusion from a cell in a high programmed state toward a cell in a lower programmed state or the erased state. This electron diffusion results in a lowering and widening of the threshold distribution for a programmed state and therefore impairs the ability to read back the cell.

Techniques provided herein address the above-mentioned issues. In one aspect, a method for fabricating a three-dimensional, charge-trapping memory device increases the refractive index of the portions of the charge-trapping layer which are adjacent to the word line layers, relative to the refractive index of portions of the charge-trapping layer which are adjacent to the dielectric layers. For example, the portions of the charge-trapping layer which are adjacent to the word line layers may be exposed by removing a sacrificial material in the word line layers, then doped to increase the refractive index. Subsequently, a metal can be deposited in the word line layers. A corresponding three-dimensional, charge-trapping memory device is also provided.

In one approach, the charge-trapping layer is silicon oxynitride (SiON) and is doped with silicon (Si) or nitrogen (N). In another approach, the charge-trapping layer is hafnium oxide (HfO) and is doped with hafnium (Hf). In another approach, the charge-trapping layer is hafnium silicon oxynitride (HfSiON) and is doped with hafnium, silicon or nitride. Other doped compounds are possible as well.

The following discussion provides details of the construction of example memory devices and of related techniques which address the above and other issues.

Figure 1A:
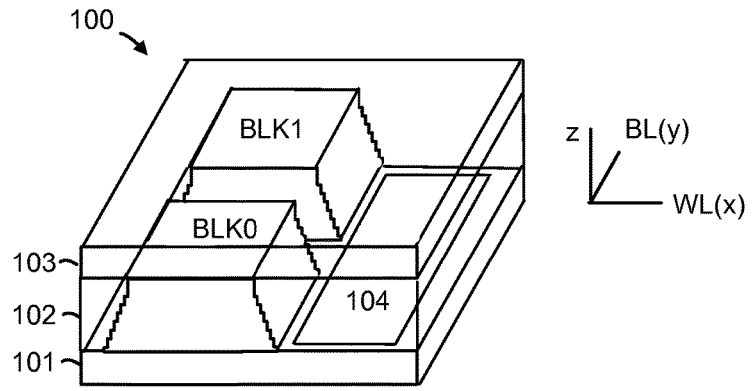
FIG. 1A is a perspective view of a 3D stacked non-volatile memory device.

FIG. 1A is a perspective view of a 3D stacked non-volatile memory device. The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
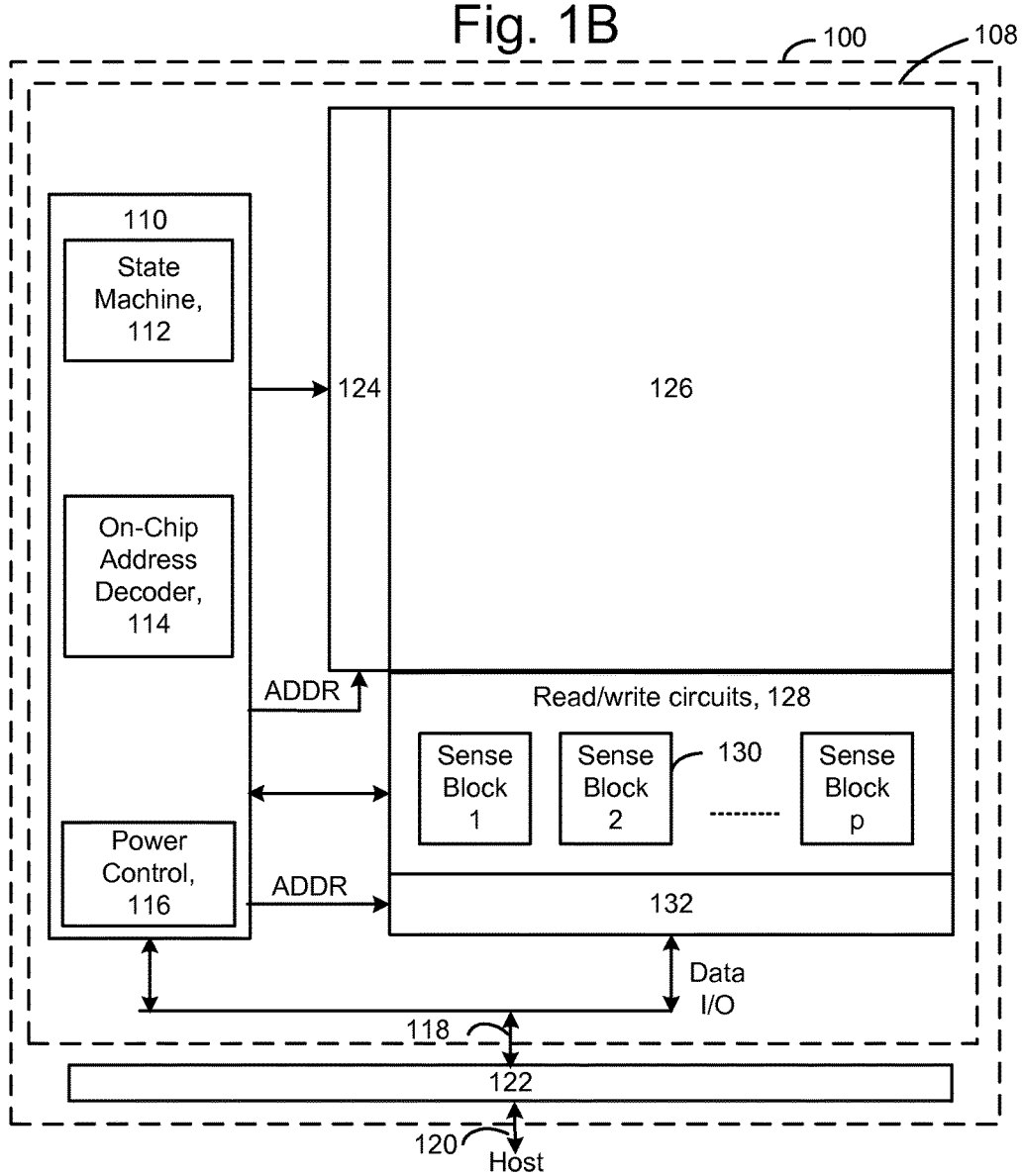
FIG. 1B is a functional block diagram of a memory device such as the 3D stacked non-volatile memory device 100 of FIG. 1A.

FIG. 1B is a functional block diagram of a memory device such as the 3D stacked non-volatile memory device 100 of FIG. 1A. The memory device 100 may include one or more memory die 108. The memory die 108 includes a memory structure 126 of memory cells, such as an array of cells, control circuitry 110, and read/write circuits 128. In a 3D configuration, the memory array can include the blocks BLK0 and BLK1 of FIG. 1A. The memory structure 126 is addressable by word lines via a row decoder 124 and by bit lines via a column decoder 132. The read/write circuits 128 include multiple sense blocks 130 (sensing circuitry) and allow a page of memory cells to be read or programmed in parallel. Typically a controller 122 is included in the same memory device 100 (e.g., a removable storage card) as the one or more memory die 108. Commands and data are transferred between the host and controller 122 via lines 120 and between the controller and the one or more memory die 108 via lines 118.

The memory structure may comprise one or more array of memory cells including a 3D array. The memory structure may comprise a monolithic three dimensional memory array in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a Si substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers (WLLs) in a 3D configuration, SGS and SGD transistors and source lines. The sense blocks 130 can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks 130, read/write circuits 128, and controller 122, and so forth.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as Si.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figures 2A, 2B:
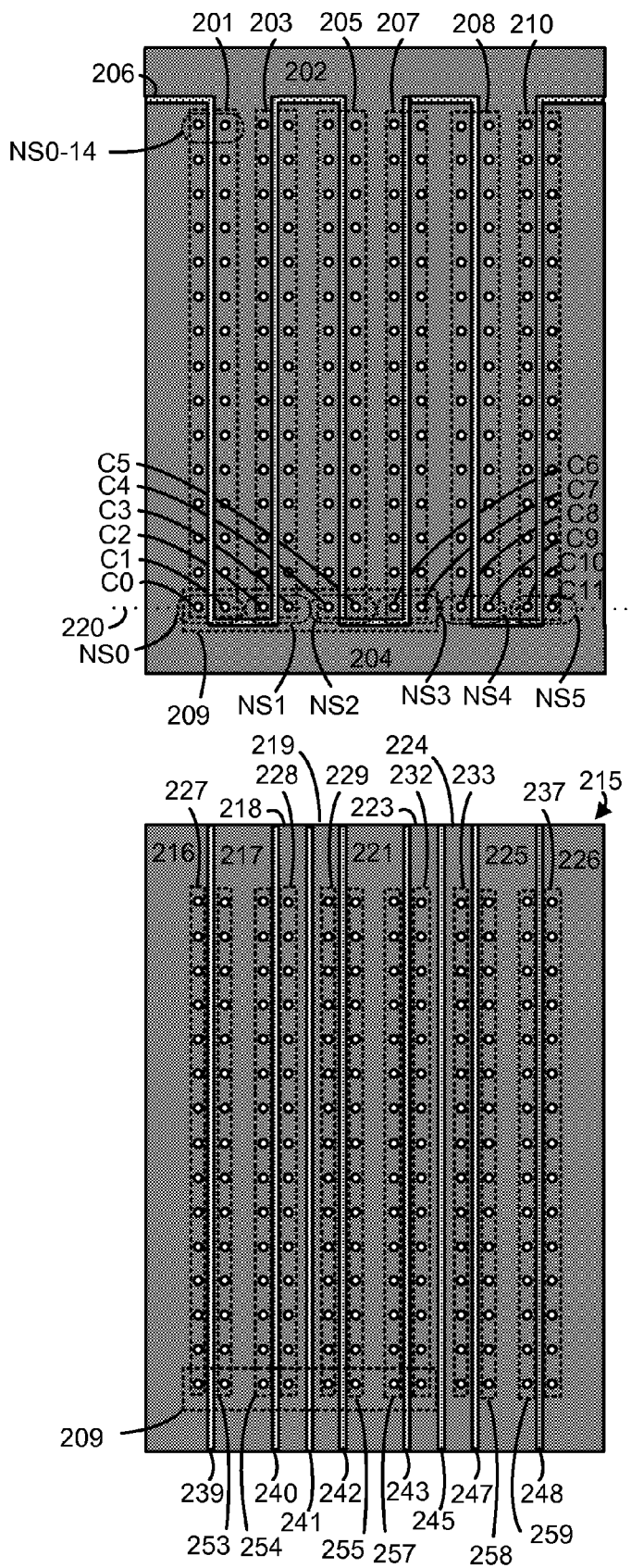
FIG. 2A depicts a top view of example word line layers 202 and 204 in a U-shaped NAND embodiment, as an example implementation of BLK0 in FIG. 1A.
FIG. 2B depicts a top view of example select gate layer portions, consistent with FIG. 2A.

FIG. 2A depicts a top view of example word line layers 202 and 204 in a U-shaped NAND embodiment, as an example implementation of BLK0 in FIG. 1A. In a 3D stacked memory device, memory cells are formed along memory holes which extend through alternating conductive and dielectric layers in a stack. The memory cells are typically arranged in NAND strings. Each conductive layer can include one or more word line layers. A word line layer is an example of a word line.

The view is of a representative layer among the multiple WLLs in a stack. Referring also to FIG. 2C, the stack includes alternating dielectric and conductive layers. The dielectric layers include DL0 to DL25 and may be made of SiO2, for instance. The conductive layers include a back gate layer (BGL), data-storing word line layers WLL0 to WLL19, dummy (non-data-storing) word line layers DWLLa and DWLLb, and select gate layers SGL1, SGL2 and SGL3. The word line layers are conductive paths to control gates of the memory cells at the layer. Moreover, each select gate layer may comprises conductive lines to select gate transistors (e.g., SGD and/or SGS transistors).

The word line layers of FIG. 2A may represent any one of the word line layers in FIG. 2C. These conductive layers may include doped polysilicon, metal such as tungsten or metal silicide, for instance. An example voltage of 5-10 V may be applied to the back gate to maintain a conductive state which connects the drain- and source-side columns.

For each block, each conductive layer may be divided into two word line layers 202 and 204 which are insulated from one another by a slit 206. The slit is formed by etching a void which extends vertically in the stack, typically from an etch stop layer at the bottom to at least a top layer of the stack, then filling the slit with insulation. This is an example of the type of etching which can result in the accumulation of charges in the top conductive layer of the stack. The slit 206 is a single continuous slit which extends in a zig-zag pattern in the block. This approach can provide greater flexibility in controlling the memory cells since the WLLs can be driven independently.

Each block includes memory holes or pillars which extend vertically in the stack, and comprise a column of memory cells such as in a NAND string. Each circle represents a memory hole or a memory cell associated with the word line layer. Example columns of memory cells along a line 220 include C0 to C11. Columns C0, C3, C4, C7, C8 and C11 represent the drain side columns of respective NAND strings. Columns C1, C2, C5, C6, C9 and C10 represent the source side columns of respective NAND strings. The figure represents a simplification, as many more rows of memory holes will typically be used, extending to the right and left in the figure. Also, the figures are not necessarily to scale. The columns of memory cells can be arranged in subsets such as sub-blocks.

Further, the NAND strings are arranged in sets, where each NAND string in a set has an SGD transistor with a common control gate voltage. See also FIG. 2B. Regions 201, 203, 205, 207, 208 and 210 each represent a set of NAND strings, or a set of memory cells in a word line layer. For example, region 210 includes NAND strings NS0, . . . , NS0-14. A programming operation can involve one set of NAND strings. Each NAND string in a set can be associated with a respective bit line which is independently controlled to allow or inhibit programming.

The drawings are not to scale and do not show all memory columns. For example, a more realistic block might have twelve memory columns in the y direction as shown, but a very large number such as 32,000 memory columns in the x direction, for a total of 384,000 memory columns in a block. With U-shaped NAND strings, 192,000 NAND strings are provided in this example. With straight NAND strings, 384,000 NAND strings are provided in this example. Assuming there are twenty-four memory cells per column, there are 384,000×24=9,216,000 memory cells in the set.

FIG. 2B depicts a top view of example select gate layer portions, consistent with FIG. 2A. In one approach, the select gate layer 215 is different than a WLL in that a separate SGD layer portion or line, is provided for each set of NAND strings. That is, each single row of SGD transistors extending in the x direction is separately controlled. In other words, the control gates of the SGD transistors in each set of NAND strings are commonly controlled.

Further, an SGS layer portion or line is provided for a pair of rows of SGS transistors extending in the x direction, in one approach, for adjacent sets of NAND strings. Optionally, additional slits are used so that a separate SGS layer portion is provided for a single row of SGS transistors extending in the x direction. Thus, the control gates of the SGS transistors in a pair of rows of SGS transistors, or in a single row of SGS transistors, are also commonly controlled.

The SGS and SGD layer portions are created due to slits 239, 240, 241, 242, 243, 245, 247 and 248. The slits extend partway down in the stack as depicted by example slit 241 in FIG. 2C. Regions 227, 228, 229, 232, 233 and 237 represent SGD transistors in SGD layer portions 216, 218, 219, 223, 224 and 226, respectively. Regions 253 and 254, 255 and 257, and 258 and 259 represent SGS transistors in SGS layer portions 217, 221 and 225, respectively. Regions 255 and 257, 258 and 259, represent SGS transistors in SGS layer portions 221 and 225, respectively. The portion 209 from FIG. 2A is repeated for reference.

The select gate transistors are associated with NAND strings NS0-NS5.

FIG. 2C depicts an embodiment of a stack 231 showing a cross-sectional view of the portion 209 of FIG. 2A, along line 220. This example includes three select gate layers, SGL1, SGL2 and SGL3. In this case, the slit extends down to DL22, so that three separate layers of select gate transistors are formed in each column of each NAND string. The stack has a top 287 and a bottom 238.

The conductive layers of the select gates can have a same height (channel length) as the conductive layers of the memory cells, in one approach. This facilitates the fabrication of the memory device. In a column, the individual select gate transistors together are equivalent to one select gate transistor having a channel length which is the sum of the channel lengths of the individual select gate transistors. Further, in one approach, select gate transistors in a column (e.g., in layers SGL1, SGL2 and SGL3) are connected and received a common voltage during operations. The SGS transistors can have a similar construction as the SGD transistors. Further, the SGS and SGD transistors can have a similar construction as the memory cell transistors.

The substrate may be p-type and can provide a ground which is connected to the top select gate layer, in one approach. A via 244 connects a drain side of C0 and NS0 to a bit line 288. A via 262 connects a source side of C1 and NS0 to a source line 289. Back gates 263, 264, 265 and 266 are provided in NS0, NS1, NS2 and NS3, respectively.

Regions D1, D2, D3 and D4 represent SGD transistors and regions S1, S2, S3 and S4 represent SGS transistors, in SGL1.

FIG. 3A depicts a top view of an example word line layer 304 of the block BLK0 of FIG. 1A, in a straight NAND string embodiment. In this configuration, a NAND string has only one column, and the source-side select gate is on the bottom of the column instead of on the top, as in a U-shaped NAND string. Moreover, a given level of a block has one WLL which is connected to each of the memory cells of the layer. Insulation-filled slits 346, 347, 348, 349 and 350 can also be used in the fabrication process to provide structural support for the stack when undoped polysilicon layers are removed by a wet etch and a dielectric is deposited to form the alternating dielectric layers. A dashed line 305 extends through columns C12-C17. A cross-sectional view along line 305 of portion 307 is shown in FIG. 3C.

Regions 340, 341, 342, 343, 344 and 345 represent the memory cells (as circles) of respective sets of NAND strings. For example, region 340 represents memory cells in NAND strings NS0A, . . . , NS0A-14. Additional NAND strings include NS1A, NS2A, NS3A, NS4A and NS5A.

Alternatively, the layer 304 represents an SGS layer, in which case each circle represents an SGS transistor.

FIG. 3B depicts a top view of an example SGD layer 362, consistent with FIG. 3A. Slits 357, 358, 359, 360 and 361 divide the SGD layer into portions 363, 364, 365, 366, 367 and 368. Each portion connects the SGD transistors in a set of NAND strings. For example, SGD layer portion 363 or line connects the SGD transistors in the set of NAND strings NS0A to NS0A-14. Regions 351, 352, 353, 354, 355 and 356 represent the SGD transistors (as circles) of respective sets of NAND strings in the SGD layer portions 363, 364, 365, 366, 367 and 368, respectively. The portion 307 from FIG. 3A is also repeated. The select gate transistors are associated with NAND strings NS0A-NS5A.

FIG. 3C1 depicts an embodiment of a stack 376 showing a cross-sectional view of the portion 307 of FIG. 3A, along line 305. In this example, three SGD layers, three SGS layers and dummy word line layers DWLL1 and DWLL2 are provided. Columns of memory cells corresponding to NAND strings NS0A-NS3A are depicted in the multi-layer stack. The stack includes a substrate 101, an insulating layer 250 on the substrate, and a portion of a source line SL0A. Additional straight NAND strings in a SGD line subset extend behind the NAND strings depicted in the cross-section, e.g., along the x-axis. NS0A has a source end SEa and a drain end DEa. The slits 346, 347 and 348 from FIG. 3A are also depicted. A portion of the bit line BL0A is also depicted. A conductive via 373 connects DEa to BL0A. The columns are formed in memory holes MH0-MH4. The memory holes are columnar and extend at least from a top 370 to a bottom 371 of the stack.

The source line SL0A is connected to the source ends of each NAND string. SL0A is also connected to other sets of memory strings which are behind these NAND strings in the x direction.

Word line layers, e.g., WLL0-WLL23, and dielectric layers, e.g., DL0-DL24, are arranged alternatingly in the stack. SGS transistors SGS1a, SGS1b, SGS1c and SGS1d are formed in the SGS1 layer. Regions SGD1a, SGD1b, SGD1c and SGD1d represent SGD transistors.

A region 246 of the stack is shown in greater detail in FIG. 4A1.

FIG. 3C2 to 3C6 show the stack 376 of FIG. 3C1 in successive phases of fabrication before the configuration of FIG. 3C1, consistent with the process of FIG. 5.

FIG. 3C2 shows a stack 376a comprising alternating word line layers and dielectric layers, where memory holes have been formed, consistent with step 500 of FIG. 5. Initially, the insulating layer 250 is formed on the substrate 101. The source line SL0A is then formed, such as from doped polysilicon. A series of layers are then deposited in turn, one layer at a time. Specifically, word line layers WLL0-WLL22 are provided for data-storing memory cells, and word line layers DWLL1 and DWLL2 are provided for dummy or non-data-storing memory cells. Additional control gate layers SGS1, SGS2 and SGS3 are provided for SGS select gate transistors, and control gate layers SGD1, SGD2 and SGD3 are provided for SGD select gate transistors. The word line layers are also control gate layers. At this stage, the word line layers and control gate layers comprise a sacrificial material such as silicon nitride (SiN) which will be removed at a later stage of the fabrication process. The dielectric layers are DL0-DL27. After the stack is formed, memory holes MH0-MH4 are formed in the stack such as by dry etching.

A word line layer can refer to layers of material at specified heights in the stack, between the dielectric layers. Typically, a sacrificial material is initially used and later replaced by a metal which forms the final word line.

FIG. 3C3 shows a stack 376b which is formed from the stack of FIG. 3C2 after depositing materials in the memory holes, consistent with steps 501 and 502 of FIG. 5. A series of depositions are made via the open top portions of the memory holes to fill the memory holes with filler materials F0, F1, F2 and F3. For example, a protective oxide may be deposited first, followed by a charge-trapping layer, a tunnel oxide, a channel material (e.g., polysilicon) and a dielectric core filler. After the memory holes are filled, voids such as slits 346, 347 and 348 are formed in the stack. See FIG. 4B3 for further details.

FIG. 3C4 shows a stack 376c which is formed from the stack of FIG. 3C3 after etching away of the sacrificial material in the word line layers, consistent with steps 503 to 505 of FIG. 5. A wet etchant is introduced via the top portions of the voids. The etchant removes the sacrificial material in the word line layers and other control gate layers. In one approach, a first etchant is used to remove the sacrificial material to thereby expose the protective oxide, which is an outermost layer in the memory holes. See FIG. 4B4 for further details. A second etchant is then introduced to remove portions of the protective oxide which are adjacent to the word line layers and other control gate layers to thereby expose portions of the charge-trapping layer, which is the second outermost layer in the memory holes. See FIG. 4B5 for further details. In another approach, the same etchant removes both the sacrificial material and the portions of the protective oxide. See FIGS. 4B4 and 4B5 for further details.

Subsequently, a dopant is introduced via the open top portions of the voids and the dopant diffuses partway into the exposed portions of the charge-trapping layer. See FIG. 4B6 for further details. Subsequently, an anneal of the stack is performed to cause the dopant to diffuse further into the charge-trapping layer. See FIG. 4B7 for further details.

FIG. 3C5 shows a stack 376d which is formed from the stack of FIG. 3C4 after depositing the metal for the word lines, consistent with step 508 of FIG. 5. Materials are deposited via the top of the voids, where these materials are used in the word line layers and other control gate layers. The materials can include a blocking oxide layer, a high k dielectric, a metal barrier material such as titanium nitride (TiN) and a metal such as tungsten (W). The metal includes vertically-extending portions 377 in the voids and horizontally-extending portions 378 in the word line layers and other control gate layers. The blocking oxide layer, high k dielectric and metal barrier material are not specifically depicted in this figure. See FIG. 4B1 for further details.

FIG. 3C6 shows a stack 376e which is formed from the stack of FIG. 3C5 after etching away material in the voids, consistent with step 509 of FIG. 5.

FIG. 4A1 depicts a view of the region 246 of FIG. 3C1 in an embodiment in which charge loss occurs by lateral diffusion due to a uniform refractive index in the charge-trapping layer 403. A memory cell MC0 is in WLL0 and a memory cell MC1 is in WLL1. A memory cell may extend circumferentially around a memory hole. The dielectric layers DL5 and DL6 are also depicted. As mentioned, a number of layers can be deposited along the sidewalls of the memory holes and within each word line layer, e.g., using atomic layer deposition. For example, a vertical column of materials can be formed in each memory hole which includes a charge-trapping layer or film (CTL) 403 such as SiN or other nitride, a tunnel oxide (TNL) 404, a polysilicon body or channel (CH) 405, and a dielectric core (DC) 406. Each layer may be annular while the dielectric core is cylindrical. The charge-trapping layer includes portions 403a and 403c which are adjacent to the dielectric layers DL6 and DL5, respectively (these are examples of dielectric-adjacent portions), and portions 403b and 403d which are adjacent to the word line layers WLL1 and WLL0 (these are examples of word line-adjacent portions), respectively Additionally, a number of layers of film can be deposited in the word line layers. For example, WLL0 includes a block oxide (BOX) 402, a block high-k material 401, a metal barrier 400, and a conductive metal such as W 399 as a control gate. For example, control gates CG0 and CG1 are provided for the memory cells MC0 and MC1, respectively. In another approach, all of these layers except the metal are provided in the memory hole. Additional memory cells are similarly formed throughout the memory holes. The layers in the memory hole form a columnar active area (AA) of the NAND string.

When a memory cell is programmed, electrons are stored in a portion of the CTL which is associated with the memory cell, e.g., portions 403b and 403d. For example, an electron 410 is in the portion 403b. These electrons are drawn into the CTL from the channel, and through the TNL. The Vth of a memory cell is increased in proportion to the amount of stored charge. During an erase operation, the electrons return to the channel.

As mentioned, the electrons can diffuse in the charge-trapping layer away from a memory cell and toward another memory cell with a lower threshold voltage. This movement is represented by the arrows in the CTL 403. For example, an electron 411 has diffused from the portion 403b to the portion 403c, lowering the threshold voltage of MC1.

Generally, data retention loss in a charge-trapping memory cell includes two components. One component is charge loss via the tunnel oxide or the blocking layer, and the other component is lateral charge migration. For example, in a 3D memory device, a continuous charge-trapping layer extends across multiple memory cells, such as in a NAND string. As a result, the injected electrons during programming can diffuse laterally to the adjacent word lines by hopping through the shallow traps in the charge-trapping layer. This lateral diffusion is data state dependent. In a worst case, when a cell is programmed to the highest programmed state and the adjacent cells on either side remain in the erase state, a large lateral electric field can accelerate the charge hopping. One way to improve data retention is to suppress lateral charge migration, such as in the memory device of FIG. 4B1.

FIG. 4A2 depicts widening of threshold voltage distributions due to lateral charge diffusion, in an example embodiment in which there is an erased state and three programmed states, consistent with FIG. 4A1. The Vth distributions 650, 660, 670 and 680 represent the erased (E) state, the A state, the B state and the C state, respectively, immediately after programming. The A, B and C states are examples of programmed state in a four level memory device. Additional states can be used as well. For example, eight level and sixteen level memory devices have been proposed. The Vth distributions 661, 671 and 681 represent the A, B and C states, respectively, after charge loss which occurs over time.

When a memory cell on a selected word line is subsequently read back, control gate read voltages such as VreadA, VreadB and VreadC are applied to the memory cell while sensing circuitry determine whether the memory cell is in a conductive state. At the same time, a read pass voltage, Vread (e.g., 8-9 V), is applied to the remaining word lines.

FIG. 4B1 depicts a view of the region 246 of FIG. 3C1 in an embodiment in which charge loss by lateral diffusion is reduced due to an increased refractive index in portions of the charge-trapping layer 403 which are adjacent to the word line layers. Here, the charge-trapping layer 413 includes portions 413a and 413c which are adjacent to the dielectric layers DL6 and DL5, respectively, and portions 413b and 413d which are adjacent to the word line layers WLL1 and WLL0, respectively. That is, the portions 413a and 413c are at a common height in the stack with the dielectric layers DL6 and DL5, respectively. Further, the portion 413b extends throughout the height of WLL1, from a top of DL5 to a bottom of DL6. The portion 413c extends throughout the height of DL5, from a top of WLL0 to a bottom of WLL1. The portions 413a and 413c are at a common height in the stack with the dielectric layers DL6 and DL5, respectively. Similarly, the portions 413b and 413d are at a common height in the stack with the word line layers WLL1 and WLL0, respectively.

An example electron 420 is depicted in the portion 413b. Additionally, portions 414a and 414b of protective oxide are adjacent to the dielectric layers DL6 and DL5, respectively. These are portions of the protective oxide layer 414 of FIG. 4B4 which remain after etching the protective oxide layer. The portion 414a is an oxide region which is between the dielectric layer DL6 and the portion 413a of the charge-trapping layer which is adjacent to the dielectric layer DL6. Similarly, the portion 414b is an oxide region which is between the dielectric layer DL5 and the portion 413c of the charge-trapping layer which is adjacent to the dielectric layer DL5. The portion 414b extends throughout the height of DL5, from a top of WLL0 to a bottom of WLL1. Further, the portions 413b and 413d of the charge-trapping layer 413 which are adjacent to the word line layers WLL1 and WLL0, respectively, comprise charge-storing regions of memory cells MC0 and MC1, respectively, in the NAND string NS0A of FIG. 3C1.

In one approach, the refractive index (RI) alternates between regions of lower and higher values along the length of the charge-trapping layer. Thus, there are regions of the charge-trapping layer with a relatively higher RI alternating with regions of the charge-trapping layer with a relatively lower RI. For example, the refractive index of the portions of the charge-trapping layer which are adjacent to the dielectric layers can be below 1.75, and the refractive index of the portions of the charge-trapping layer which are adjacent to the word line layers can be above 1.9. In one approach, the refractive index is as high as 1.99 or 2.06 and a low as 1.7. A charge-trapping region with a higher refractive index guarantees the proper program, erase and endurance characteristics of the memory cells. A charge-trapping region with a lower refractive index has a lower trap density, thus reducing the possibility of trap-assisted tunneling and suppressing the lateral charge migration. Moreover, the larger the difference between the higher and lower refractive indexes, the more effective the isolation between the memory cells so that better data retention is achieved.

FIG. 4B2 depicts a partial cross-sectional view of the region 246 of FIG. 4B1 along line 444. As mentioned, the memory hole can be generally circular so that the deposited films are generally annular.

Figures 7, 8:
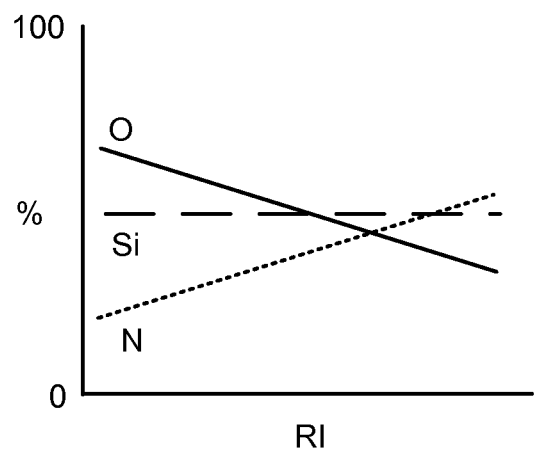

FIG. 4B3 to 4B7 show the region 246 of FIG. 4B1 in successive phases of fabrication, consistent with the process of FIG. 5 and with FIG. 3C1 to 3C6.

FIG. 4B3 shows the region 246 after processing which is consistent with steps 500 to 502 of FIG. 5 and with FIG. 3C3. WLL0 and WLL1 include a sacrificial material 415 and 416, respectively, such as SiN. The layers which are deposited in the memory hole include the protective oxide 414, the charge-trapping layer 413, the tunnel oxide layer 404, the channel material 405 and the dielectric core 406. The protective oxide may be in contact with the sacrificial material.

FIG. 4B4 shows the region 246 after processing which is consistent with steps 503 to 504 of FIG. 5 and with FIG. 3C4. The sacrificial material is removed so that horizontally-extending voids are created in the word line layers, and portions 414c and 414d of the protective oxide are exposed via the word line layers WLL1 and WLL0, respectively.

FIG. 4B5 shows the region 246 after processing which is consistent with step 505 of FIG. 5 and with FIG. 3C4. The portions 414c and 414d of the protective oxide are removed by etching, exposing the portions 413b and 413c of the charge-trapping layer to the horizontally-extending voids.

FIG. 4B6 shows the region 246 after processing which is consistent with step 506 of FIG. 5. The doping of the portions of the charge trapping layer which are adjacent to the word line layers results in portions 413b1 and 413d1 which include the dopant and portions 413b2 and 413d2 which do not include the dopant. The extent to which the dopant penetrates into the charge-trapping layer depends on various factors such as the width of the charge-trapping layer and the doping conditions.

FIG. 4B7 shows the region 246 after processing which is consistent with step 507 of FIG. 5. The annealing causes the dopant to diffuse throughout the width of the charge-trapping layer to form doped regions 413b3 and 413d3 in WLL1 and WLL0, respectively.

FIG. 5 depicts an example process for fabricating a memory device such as in FIGS. 3C1 and 4B1. Step 500 includes depositing a stack comprising alternating dielectric layers and word line layers on substrate. For example, see FIGS. 3C2 and 4B3. Step 501 includes etching memory holes in the stack, e.g., using a dry etch. For example, see FIG. 3C3. Step 502 includes depositing a protective oxide, a charge-trapping layer, a tunnel oxide, a channel material and dielectric core material in the memory holes. For example, see FIGS. 3C3 and 4B3.

Since the charge-trapping material is deposited in the memory holes, a continuous charge-trapping film may extend throughout a NAND string (see FIG. 4B1). This is in contrast to an approach which deposits the charge-trapping material in the word line layers (see FIG. 4A1). The former approach allows for a thicker metal in the word line layers and therefore a reduced resistance.

The charge-trapping material can be of various types. Advantageous materials are compounds which exhibit a charge-trapping behavior and which can be doped to increase the refractive index. Generally, oxides and nitrides are compatible with processing of a Si wafer. Also, the charge-trapping material should have a band gap which is fairly different than the band gap of the blocking layer (e.g., SiO2). See FIG. 7 for examples of suitable charge-trapping materials.

Step 503 includes etching vertical voids such as slits in the stack, e.g., using a dry etch. For example, see FIGS. 3C4 and 4B4. Step 504 includes providing an etchant (e.g., a wet etchant) via the vertical voids to remove sacrificial material from word line layers, forming horizontal voids. For example, see FIG. 4B4.

Step 505 includes providing an etchant (e.g., a wet etchant) via the voids to remove portions of the protective oxide, exposing portions of the charge-trapping layer which were adjacent to the sacrificial layers. For example, see FIGS. 3C4 and 4B5. As mentioned in connection with FIG. 3C4, one approach is to use a first etchant to remove the sacrificial material and a second etchant to remove the protective oxide. Another approach is to use the same etchant to remove both the sacrificial material and the portions of the protective oxide. In this case, the protective oxide is more resistant to being etched so that the sacrificial material can be fully removed before the protective oxide is reached. The etching of the protective oxide should be stopped when the charge-trapping material is reached to avoid damage. The etching of the protective oxide can be controlled by parameters such as etching time.

Step 506 includes providing dopant via the voids to dope the exposed portions of the charge-trapping layer. For example, see FIGS. 4B7 and 7.

Step 507 includes performing an anneal. This causes the dopant to diffuse further into the portions of the charge-trapping layer which are adjacent to the word line layers. The annealing temperature can be between 850 C and 1000 C, for example, with an annealing time of 30 minutes or less at 850 C or an annealing time of 60 seconds or less at 1000 C. A relatively longer annealing time can be used when the charge-trapping layer is relatively thicker. The annealing time should be carefully controlled to constrain the dopants within the portions of the charge-trapping layer which are adjacent to the word line layers, and avoid the entry of the dopants into the portions of the charge-trapping layer which are adjacent to the dielectric layers.

Step 508 includes providing a blocking oxide layer, a high k dielectric, a metal barrier layer and a metal via the voids. These materials fill the horizontally-extending voids and the vertically-extending voids.

Step 509 includes etching the vertical portions of the voids, e.g., using a dry etch, and subsequently depositing insulation. Step 510 includes additional processing, such as connecting the stack to bit lines and other control lines.

FIG. 6 depicts a circuit diagram of a NAND string consistent with the memory devices of FIGS. 2C and 3C1. An example NAND string NS0A includes SGD transistors 601, 602 and 603, a drain-side dummy memory cell 604, data-storing memory cells 605, . . . , 606, 607, 608, . . . , 609, a source-side dummy memory cell 610, and SGS transistors 611, 612 and 613.

The use of one or more dummy memory cells between the select gate transistors and the data-storing memory cells is useful since program disturb can be greater for memory cells adjacent to, or close to, the select gate transistors. These edge cells have a lower amount of channel boosting due to constraints on the voltages of the select gate transistors of an inhibited NAND string.

A bit line 615 connects the drain end of the NAND string to sensing circuitry 600, which is used to sense the NAND string during operations involving the select gate transistors and the memory cells. A source line 614 is connected to a source end of the NAND string. Voltage drivers can be used to provide the voltages depicted. For example, Vsg is applied to the control gates of the SGD transistors, which are connected to one another and to the control gates of the SGS transistors, which are connected to one another. Vsg can also be applied to the dummy memory cells 604 and 610. Vbl is the bit line voltage and Vsl is the source line voltage.

In this example, the memory cell 607 is selected for programming and is connected to a selected word line WLLn which receives Vpgm. The unselected memory cells receive a pass voltage, Vpass.

FIG. 7 is a table of example materials for the word line-adjacent portions and the dielectric-adjacent portions of a charge-trapping layer. The table depicts a case number, a material of the word line-adjacent portion and a material of the dielectric-adjacent portion. The materials listed include SiON (silicon oxynitride), HfO (hafnium oxide), HfSiON (hafnium silicon oxynitride), AlO (aluminum oxide), ZrO2 (zirconium oxide), Y2O3 (yttrium oxide), HfAlO (hafnium aluminum oxide), SiN (silicon nitride), SiCN (silicon carbonitride) and SiBN (silicon boron nitride).

Case 1 comprises Si-rich SiON for the WL-adjacent portions and SiON which is not Si-rich (but may be oxygen-rich) for the dielectric-adjacent portions. The dopant of step 506 is Si. The amount of Si may be greater than the amount of O and/or N.

Case 2 comprises N-rich SiON for the WL-adjacent portions and SiON which is not N-rich (but may be oxygen-rich) for the dielectric-adjacent portions. The dopant of step 506 is N. The amount of N may be greater than the amount of O and/or Si.

Case 3 comprises Hf-rich HfO for the WL-adjacent portions and HfO which is not Hf-rich (but may be oxygen-rich) for the dielectric-adjacent portions. The dopant of step 506 is Hf. The amount of Hf may be greater than the amount of O.

Case 4 comprises Hf-rich HfSiON for the WL-adjacent portions and HfSiON which is not Hf-rich (but may be oxygen-rich) for the dielectric-adjacent portions. The dopant of step 506 is Hf. The amount of Hf may be greater than the amount of Si, O and/or N.

Case 5 comprises Si-rich HfSiON for the WL-adjacent portions and HfSiON which is not Si-rich (but may be oxygen-rich) for the dielectric-adjacent portions. The dopant of step 506 is Si. The amount of Si may be greater than the amount of Hf, O and/or N.

Case 6 comprises N-rich HfSiON for the WL-adjacent portions and HfSiON which is not N-rich (but may be oxygen-rich) for the dielectric-adjacent portions. The dopant of step 506 is N. The amount of N may be greater than the amount of Hf, Si and/or O.

Case 7 comprises Al-rich AlO for the WL-adjacent portions and AlO which is not Al-rich (but may be oxygen-rich) for the dielectric-adjacent portions. The dopant of step 506 is Al. The amount of Al may be greater than the amount of O.

Case 8 comprises Zr-rich ZrO2 for the WL-adjacent portions and ZrO2 which is not Zr-rich (but may be oxygen-rich) for the dielectric-adjacent portions. The dopant of step 506 is Zr. The amount of Zr may be greater than the amount of O.

Case 9 comprises Y-rich Y2O3 for the WL-adjacent portions and Y2O3 which is not Y-rich (but may be oxygen-rich) for the dielectric-adjacent portions. The dopant of step 506 is Y. The amount of Y may be greater than the amount of O.

Case 10 comprises Hf-rich HfAlO for the WL-adjacent portions and HfAlO which is not Hf-rich (but may be oxygen-rich) for the dielectric-adjacent portions. The dopant of step 506 is Hf. The amount of Hf may be greater than the amount of Al and/or O.

Case 11 comprises Al-rich HfAlO for the WL-adjacent portions and HfAlO which is not Al-rich (but may be oxygen-rich) for the dielectric-adjacent portions. The dopant of step 506 is Al. The amount of Al may be greater than the amount of Hf and/or O.

Case 12 comprises Si-rich SiN for the WL-adjacent portions and SiN which is not Si-rich (but may be oxygen-rich) for the dielectric-adjacent portions. The dopant of step 506 is Si. The amount of Si may be greater than the amount of N.

Case 13 comprises SiCN for the WL-adjacent portions and SiN for the dielectric-adjacent portions. The dopant of step 506 is C.

Case 14 comprises SiBN for the WL-adjacent portions and SiN for the dielectric-adjacent portions. The dopant of step 506 is B.

For example, regarding cases 1 and 2, SiON can be written as $Si(x)O(y)N(1-x-y)$. The variables x and y denote the relative amounts (e.g., atomic percent) of Si and O, respectively, and $(1-x-y)$ denotes the relative amount of N. Specifically, FIG. 8 depicts a plot of atomic percent versus refractive index (RI) for SiON with varying amounts of O and N. In this example, the amount of Si is fixed while the amount of nitrogen increases and the amount of oxygen correspondingly decreases. The RI increases in proportion to the amount of N. Similarly, the amount of N can be fixed while the amount of Si increases and the amount of oxygen correspondingly decreases. In this case, the RI increases in proportion to the amount of Si.

As an example, with a Si content of about 50% in Si-rich SiON, the RI is about 2.1. The SiON is Si-rich since there is a relatively high percentage of Si. For example, the amount of Si can be greater than the amount of O and/or N. In oxygen-rich SiON, an amount of O is greater than the amount of Si and/or N. The degree of richness can be expressed as a percentage. Generally, the WL-adjacent portions of the charge-trapping layer which are rich in one element have a higher percentage of the element than the dielectric-adjacent portions of the charge-trapping layer.

In some cases, the dielectric-adjacent portions of the charge-trapping layer are stoichiometric while the WL-adjacent portions of the charge-trapping layer are non-stoichiometric. In this case, the doping to cause the richness of one element causes the WL-adjacent portions to become non-stoichiometric. As an example, in case 12, the deposited charge-trapping layer may be stoichiometric silicon nitride, written as Si3N4 (the relative proportions of the elements are integer numbers). The doping with Si results in portions of non-stoichiometric silicon nitride written, e.g., as Si(3.2)N4 (the relative proportion of one or more elements is a non-integer number). Typically, a compound which is rich in one element is non-stoichiometric.

In other cases, the dielectric-adjacent portions and the WL-adjacent portions are both non-stoichiometric. As an example, in case 1, the deposited charge-trapping layer may be non-stoichiometric silicon nitride, written as, e.g., Si(0.4)O(0.5)N(0.1). The doping with Si results in a higher concentration of Si, e.g., Si(0.45)O(0.5)N(0.05).

The composition of SiON can be adjusted in a wider range of RI compared to alternative charge-trapping materials such as silicon nitride (Si3N4), which has a relatively high RI of 1.96. Moreover, SiON has a lower trap density compared to silicon nitride so that there is a reduced likelihood of charge diffusion.

Various approaches can be used to form SiON film. A first example approach is to directly deposit a film from a reaction of silane (SiH4) or dichlorosilane (SiH2Cl2) in mixtures of ammonia (NH3) and nitrous oxide (NO or N2O) by chemical vapor deposition (CVD). A second example approach involves depositing a pure SiO2 film, then performing nitridation of the film in N2, NH3 or NO gas during annealing or plasma steps. In the first example approach, the relative amounts of N2O, NH3 and SiH4 can be adjusted to provide the desired relative amounts of O, N and Si, respectively.

Thus, doping of Si into SiON can be performed using a plasma treatment with SiH4 (silane) as a precursor to make the SiON Si-rich. Doping of N into SiON can be performed using plasma nitridation with NH3 (ammonia) as a precursor to make the SiON Si-rich. To provide a Si-rich SiON, relatively more SiH4 is used. To provide an N-rich SiON, relatively more NH3 is used.

For cases 3, 4 and 10, the RI increases in proportion to the amount of Hf. For cases 5 and 12, the RI increases in proportion to the amount of Si. For case 6, the RI increases in proportion to the amount of N. For cases 7 and 11, the RI increases in proportion to the amount of Al. For cases 8 and 9, the RI increases in proportion to the amount of Zr or Y, respectively. For cases 13 and 14, the RI increases in proportion to the amount of C or B, respectively.

In cases 1-12, the initially deposited charge-trapping material is doped with one of its constituent elements to make it richer in that element. In cases 13 and 14, the initially deposited charge-trapping material is doped with a non-constituent element.

Various other implementations are possible as well.

Accordingly, it can be seen that, in one embodiment, a memory device comprises: a stack comprising alternating word line layers and dielectric layers; a memory hole extending vertically in the stack; a channel material extending in the memory hole; an oxide extending in the memory hole around the channel material; and a charge-trapping layer extending in the memory hole around the oxide. The charge-trapping layer comprising portions which are adjacent to the word line layers and portions which are adjacent to the dielectric layers, the portions of the charge-trapping layer which are adjacent to the word line layers have a refractive index which is higher than a refractive index of the portions of the charge-trapping layer which are adjacent to the dielectric layers.

In another embodiment, a method for fabricating a memory device comprises: forming a memory hole in a stack comprising alternating word line layers and dielectric layers; depositing a charge-trapping layer in the memory hole, the charge-trapping layer comprising portions which are adjacent to the word line layers and portions which are adjacent to the dielectric layers; forming a void in the stack; providing one or more etchants in the void, the one or more etchants remove a sacrificial material in the word line layers and expose the portions of the charge-trapping layer which are adjacent to the word line layers; providing a dopant in the void, the dopant diffuses into, and increases a refractive index of, the portions of the charge-trapping layer which are adjacent to the word line layers; and providing a metal in the void to form metal word lines.

In another embodiment, a memory device comprises: a first memory cell comprising a control gate and a first region of a charge-trapping layer; a second memory cell comprising a control gate and a second region of charge-trapping layer; and a third region of charge-trapping layer between the first region of the charge-trapping layer and the second region of charge-trapping layer, wherein a refractive index of the third region of charge-trapping layer is higher than a refractive index of the first region of the charge-trapping layer and higher than a refractive index of the second region of charge-trapping layer.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A memory device, comprising:
a stack comprising alternating word line layers and dielectric layers;
a memory hole extending vertically in the stack;
a channel material extending in the memory hole;
an oxide extending in the memory hole around the channel material; and
a charge-trapping layer extending in the memory hole around the oxide, the charge-trapping layer is continuous and extends across multiple memory cells and comprises portions which are adjacent to the word line layers and portions which are adjacent to the dielectric layers, the portions of the charge-trapping layer which are adjacent to the word line layers comprise silicon-rich silicon oxynitride and the portions of the charge-trapping layer which are adjacent to the dielectric layers comprise oxygen-rich silicon oxynitride, wherein in the silicon-rich silicon oxynitride, an atomic percentage of silicon exceeds an atomic percentage of oxygen and an atomic percentage of nitrogen and in the oxygen-rich silicon oxynitride, an atomic percentage of oxygen exceeds an atomic percentage of silicon and an atomic percentage of nitrogen.

2. The memory device of claim 1, wherein:
each word line layer comprises a blocking oxide layer, a high k dielectric and a metal, wherein the high k dielectric is between the blocking oxide layer and the metal; and
oxide regions are between the dielectric layers and the portions of the charge-trapping layer which are adjacent to the dielectric layers.

3. The memory device of claim 1, wherein:
the portions of the charge-trapping layer which are adjacent to the word line layers comprise charge-storing regions of memory cells in a NAND string.

4. The memory device of claim 1, wherein:
the portions of the charge-trapping layer which are adjacent to the word line layers and the portions which are adjacent to the dielectric layers extend across a width of the charge-trapping layer.

5. The memory device of claim 1, wherein:
a refractive index of the portions of the charge-trapping layer which are adjacent to the dielectric layers is below 1.75; and
a refractive index of the portions of the charge-trapping layer which are adjacent to the word line layers is above 1.9.

6. The memory device of claim 1, wherein:
the charge-trapping layer comprises an annular layer in the memory hole.

7. A memory device, comprising:
a first memory cell comprising a control gate and a first region of a charge-trapping layer;
a second memory cell comprising a control gate and a second region of the charge-trapping layer; and
a third region of the charge-trapping layer between the first region of the charge-trapping layer and the second region of the charge-trapping layer, wherein the third region of the charge-trapping layer comprises oxygen-rich hafnium oxide, and the first region of the charge-trapping layer and the second region of the charge-trapping layer comprises hafnium-rich hafnium oxide, wherein in the hafnium-rich hafnium oxide, an atomic percentage of hafnium exceeds an atomic percentage of oxygen and in the oxygen-rich hafnium oxide, an atomic percentage of oxygen exceeds an atomic percentage of hafnium.

8. The memory device of claim 7, wherein:
the first memory cell and the second memory cell are adjacent memory cells in a NAND string.

9. The memory device of claim 7, wherein:
a refractive index of the third region of the charge-trapping layer is below 1.75; and
a refractive index of the first region of the charge-trapping layer and the second region of the charge-trapping layer is above 1.9.

10. The memory device of claim 7, wherein:
the charge-trapping layer is continuous and extends across multiple memory cells.

11. A memory device, comprising:
a stack comprising alternating word line layers and dielectric layers;
a memory hole extending vertically in the stack;
a channel material extending in the memory hole;
an oxide extending in the memory hole around the channel material; and
a charge-trapping layer extending in the memory hole around the oxide, the charge-trapping layer is continuous and extends across multiple memory cells and comprises portions which are adjacent to the word line layers and portions which are adjacent to the dielectric layers, the portions of the charge-trapping layer which are adjacent to the word line layers comprise nitrogen-rich silicon oxynitride and the portions of the charge-trapping layer which are adjacent to the dielectric layers comprise oxygen-rich silicon oxynitride wherein in the nitrogen-rich silicon oxynitride, an atomic percentage of nitrogen exceeds an atomic percentage of silicon and an atomic percentage of oxygen and in the oxygen-rich silicon oxynitride, an atomic percentage of oxygen exceeds an atomic percentage of silicon and an atomic percentage of nitrogen.

12. The memory device of claim 11, wherein:
a refractive index of the portions of the charge-trapping layer which are adjacent to the dielectric layers is below 1.75; and
a refractive index of the portions of the charge-trapping layer which are adjacent to the word line layers is above 1.9.

* * * * *